(12) United States Patent
Kanatzidis et al.

(10) Patent No.: US 7,847,179 B2
(45) Date of Patent: Dec. 7, 2010

(54) THERMOELECTRIC COMPOSITIONS AND PROCESS

(75) Inventors: Mercouri G. Kanatzidis, Okemos, MI (US); John Androulakis, Crete (GR); Joseph R. Sootsman, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 879 days.

(21) Appl. No.: 11/445,662

(22) Filed: Jun. 2, 2006

(65) Prior Publication Data

US 2006/0272697 A1     Dec. 7, 2006

Related U.S. Application Data

(60) Provisional application No. 60/687,769, filed on Jun. 6, 2005.

(51) Int. Cl.
*H01L 35/34* (2006.01)
*H01L 35/16* (2006.01)

(52) U.S. Cl. .................. 136/201; 136/200; 136/203; 136/236.1; 136/238; 136/239; 136/240; 136/205

(58) Field of Classification Search ............. 136/203
See application file for complete search history.

(56) References Cited

U.S. PATENT DOCUMENTS

| 2,811,440 | A | 10/1957 | Fritts et al. |
|---|---|---|---|
| 2,811,571 | A | 10/1957 | Fritts et al. |
| 2,811,720 | A | 10/1957 | Fritts et al. |
| 2,882,468 | A | 4/1959 | Wernick |
| 2,944,404 | A | 7/1960 | Fritts |
| 2,949,014 | A | 8/1960 | Belton, Jr., et al. |
| 3,004,393 | A | 10/1961 | Alsing |
| 3,006,979 | A | 10/1961 | Rich |
| 3,071,495 | A | 1/1963 | Hanlein |
| 3,073,883 | A | 1/1963 | McHugh et al. |
| 3,129,116 | A | 4/1964 | Corry |
| 3,178,895 | A | 4/1965 | Mole et al. |
| 3,213,630 | A | 10/1965 | Mole |
| 3,224,876 | A | 12/1965 | Fredrick |
| 3,238,134 | A | 3/1966 | Fleischmann |
| 3,318,669 | A | 5/1967 | Folberth |

(Continued)

FOREIGN PATENT DOCUMENTS

DE        101 42 624 A1    4/2003

(Continued)

OTHER PUBLICATIONS

DeYoreo et al., Principles of Crystal Nucleation and Growth, Biomineralization, vol. 54, Weiner Mineralogical Society of America, pp. 57-93, 2003.*

(Continued)

*Primary Examiner*—Jennifer K Michener
*Assistant Examiner*—Jayne Mershon
(74) *Attorney, Agent, or Firm*—Knobbe, Martens Olson & Bear, LLP

(57) ABSTRACT

A process for producing bulk thermoelectric compositions containing nanoscale inclusions is described. The thermoelectric compositions have a higher figure of merit (ZT) than without the inclusions. The compositions are useful for power generation and in heat pumps for instance.

37 Claims, 14 Drawing Sheets

U.S. PATENT DOCUMENTS

| | | | |
|---|---|---|---|
| 3,505,728 A | 4/1970 | Hare et al. | |
| 3,527,621 A | 9/1970 | Newton | |
| 3,527,622 A | 9/1970 | Angus et al. | |
| 3,607,444 A | 9/1971 | Debucs | |
| 3,626,704 A | 12/1971 | Coe, Jr. | |
| 3,635,037 A | 1/1972 | Hubert | |
| 3,663,307 A | 5/1972 | Mole | |
| 3,681,929 A | 8/1972 | Schering | |
| 3,779,814 A | 12/1973 | Miles et al. | |
| 3,817,043 A | 6/1974 | Zoleta | |
| 3,859,143 A | 1/1975 | Krebs | |
| 3,945,855 A | 3/1976 | Skrabek et al. | |
| 4,038,831 A | 8/1977 | Gaudel et al. | |
| 4,065,936 A | 1/1978 | Fenton et al. | |
| 4,281,516 A | 8/1981 | Berthet et al. | |
| 4,297,841 A | 11/1981 | Cheng | |
| 4,420,940 A | 12/1983 | Buffet | |
| 4,494,380 A | 1/1985 | Cross | |
| 4,499,329 A | 2/1985 | Benicourt et al. | |
| 4,608,319 A * | 8/1986 | Croopnick et al. | 428/613 |
| 4,730,459 A | 3/1988 | Schicklin et al. | |
| 4,731,338 A | 3/1988 | Ralston et al. | |
| 4,905,475 A | 3/1990 | Tuomi | |
| 4,989,626 A | 2/1991 | Takagi et al. | |
| 5,006,178 A | 4/1991 | Bijvoets | |
| 5,038,569 A | 8/1991 | Shirota et al. | |
| 5,092,129 A | 3/1992 | Bayes et al. | |
| 5,097,829 A | 3/1992 | Quisenberry | |
| 5,193,347 A | 3/1993 | Apisdorf | |
| 5,228,923 A | 7/1993 | Hed | |
| 5,232,516 A | 8/1993 | Hed | |
| 5,385,020 A | 1/1995 | Gwilliam et al. | |
| 5,429,680 A | 7/1995 | Fuschetti | |
| 5,439,528 A | 8/1995 | Miller | |
| 5,448,109 A | 9/1995 | Cauchy | |
| 5,499,504 A | 3/1996 | Mill et al. | |
| 5,584,183 A | 12/1996 | Wright et al. | |
| 5,592,363 A | 1/1997 | Atarashi et al. | |
| 5,594,609 A | 1/1997 | Lin | |
| 5,605,047 A | 2/1997 | Park et al. | |
| 5,682,748 A | 11/1997 | DeVilbiss et al. | |
| 5,726,381 A | 3/1998 | Horio et al. | |
| 5,802,856 A | 9/1998 | Schaper et al. | |
| 5,860,472 A | 1/1999 | Batchelder | |
| 5,867,990 A | 2/1999 | Ghoshal | |
| 5,900,071 A | 5/1999 | Harman | |
| RE36,242 E | 6/1999 | Apisdorf | |
| 5,921,088 A | 7/1999 | Imaizumi et al. | |
| 5,955,772 A | 9/1999 | Shakouri et al. | |
| 5,959,341 A | 9/1999 | Tsuno et al. | |
| 5,966,941 A | 10/1999 | Ghoshal | |
| 5,987,890 A | 11/1999 | Chiu et al. | |
| 6,000,225 A | 12/1999 | Choshal | |
| 6,013,204 A | 1/2000 | Kanatzidis et al. | |
| 6,060,657 A | 5/2000 | Harman | |
| 6,082,445 A | 7/2000 | Dugan | |
| 6,084,172 A | 7/2000 | Kishi et al. | |
| 6,096,966 A | 8/2000 | Nishimoto et al. | |
| 6,103,967 A | 8/2000 | Cachy et al. | |
| 6,225,550 B1 | 5/2001 | Hornbostel et al. | |
| 6,274,802 B1 | 8/2001 | Fukuda et al. | |
| 6,282,907 B1 | 9/2001 | Ghoshal | |
| 6,312,617 B1 | 11/2001 | Kanatzidis et al. | |
| 6,319,744 B1 | 11/2001 | Hoon et al. | |
| 6,334,311 B1 | 1/2002 | Kim et al. | |
| 6,346,668 B1 | 2/2002 | McGrew | |
| 6,347,521 B1 | 2/2002 | Kadotani et al. | |
| 6,366,832 B2 | 4/2002 | Lomonaco et al. | |
| 6,367,261 B1 | 4/2002 | Marshall et al. | |
| 6,401,462 B1 | 6/2002 | Bielinski | |
| 6,412,287 B1 | 7/2002 | Hughes et al. | |
| 6,444,894 B1 | 9/2002 | Sterzel | |
| 6,446,442 B1 | 9/2002 | Batchelor et al. | |
| 6,452,206 B1 | 9/2002 | Harman et al. | |
| 6,477,844 B2 | 11/2002 | Ohkubo et al. | |
| 6,481,213 B2 | 11/2002 | Carr et al. | |
| 6,510,696 B2 | 1/2003 | Guttman et al. | |
| 6,530,231 B1 | 3/2003 | Nagy et al. | |
| 6,530,842 B1 | 3/2003 | Wells et al. | |
| 6,539,725 B2 | 4/2003 | Bell | |
| 6,560,968 B2 | 5/2003 | Ko | |
| 6,563,039 B2 | 5/2003 | Caillat et al. | |
| RE38,128 E | 6/2003 | Gallup et al. | |
| 6,617,504 B2 | 9/2003 | Kajihara et al. | |
| 6,625,990 B2 | 9/2003 | Bell | |
| 6,637,210 B2 | 10/2003 | Bell | |
| 6,672,076 B2 | 1/2004 | Bell | |
| 6,812,395 B2 | 11/2004 | Bell | |
| 6,845,710 B2 | 1/2005 | Hinzpeter et al. | |
| 6,858,154 B2 | 2/2005 | Suzuki et al. | |
| 6,883,359 B1 | 4/2005 | Hartwig, Jr. | |
| 6,948,321 B2 | 9/2005 | Bell | |
| 6,959,555 B2 | 11/2005 | Bell | |
| 7,111,465 B2 | 9/2006 | Bell | |
| 7,231,772 B2 | 6/2007 | Bell | |
| 7,273,981 B2 | 9/2007 | Bell | |
| 7,326,851 B2 | 2/2008 | Sterzel et al. | |
| 7,342,169 B2 * | 3/2008 | Venkatasubramanian et al. | 136/236.1 |
| 7,365,265 B2 * | 4/2008 | Heremans et al. | 136/238 |
| 7,426,835 B2 | 9/2008 | Bell | |
| 7,465,871 B2 * | 12/2008 | Chen et al. | 136/236.1 |
| 2001/0029974 A1 | 10/2001 | Cohen et al. | |
| 2003/0094265 A1 | 5/2003 | Chu et al. | |
| 2004/0200519 A1 | 10/2004 | Sterzel et al. | |
| 2004/0261829 A1 | 12/2004 | Bell | |
| 2004/0261833 A1 | 12/2004 | Ono et al. | |
| 2005/0076944 A1 | 4/2005 | Kanatizidis et al. | |
| 2005/0241690 A1 | 11/2005 | Tajima et al. | |
| 2006/0102224 A1 | 5/2006 | Chen et al. | |
| 2006/0249704 A1 | 11/2006 | Ren et al. | |
| 2006/0272697 A1 | 12/2006 | Kanatzidis et al. | |
| 2007/0107764 A1 | 5/2007 | Kanatzidis et al. | |
| 2007/0227577 A1 | 10/2007 | Sterzel et al. | |
| 2008/0289677 A1 | 11/2008 | Bell et al. | |
| 2009/0178700 A1 | 7/2009 | Heremans et al. | |
| 2009/0235969 A1 | 9/2009 | Heremans et al. | |
| 2009/0269584 A1 | 10/2009 | Bell et al. | |

FOREIGN PATENT DOCUMENTS

| | | |
|---|---|---|
| EP | 1 102 334 | 5/2001 |
| GB | 2 027 534 | 2/1980 |
| GB | 2 267 338 | 12/1993 |
| JP | 56-18231 | 2/1981 |
| JP | 4-165234 | 6/1992 |
| JP | 5-219765 | 8/1993 |
| JP | 09-074229 | 3/1997 |
| JP | 2000-164940 | 6/2000 |
| JP | 2002-289930 | 10/2002 |
| JP | 2003-225743 | 8/2003 |
| JP | 2008-523579 | 12/2006 |
| JP | 2010-085176 | 4/2010 |
| SE | 329 870 | 10/1970 |
| SE | 337 227 | 5/1971 |
| WO | WO 98/44562 | 10/1998 |
| WO | WO 00/24040 | 4/2000 |
| WO | WO 02/065030 | 8/2002 |
| WO | WO 04/090998 | 10/2004 |
| WO | WO 2004/090998 | 10/2004 |
| WO | WO 05/036660 | 4/2005 |
| WO | WO 2005/036660 | 4/2005 |
| WO | WO 2009/091747 | 7/2009 |
| WO | WO 2009/094571 | 7/2009 |

WO  WO 2009/132314  10/2009

OTHER PUBLICATIONS

Kullerud, The Lead Sulfur System, American Journal of Science, Schairer vol. 267-A, pp. 233-256, 1969.*
Shamsuddin et al., Thermodynamic and Constitutional Studies of the PbTe-GeTe System, Journal of Materials Science, vol. 10, pp. 1849-1855, 1975.*
Ahmad, S., et al.: "Ab initio studies of the electric structure of defects in PbTe" Physical Review B, vol. 74, 2006, pp. 155205-1-155205-13, XP002554793 cited in the application paragraphs [III.A.4], [III.B.2], [III.B.3]; figure 2a.
Androulakis, John et al.,: "Nanostructuring and High Thermoelectric Efficiency in p-Type Ag(Pb1-ySny) mSbTe2+m" Wiley InterScience, Advanced Materials, 2006, 18, 1170-1173, Wiley-VCH Verlag GmbH & Co. KGaA, Weinheim.
Angrist, S. W., "Direct Energy Conversion", 3rd Edition, Ed. Ally & Bacon (1976).
Bell, L.E., "Increased Thermoelectric System Thermodynamic Efficiency by Use of Convective Heat Transport," Proc. 21st Int'l Conf. on Thermolectrics, Long Beach, CA (Aug. 2002).
Bell, L.E., "Use of Thermal Isolation to Improve Thermoelectric System Operating Efficiency," Proc. 21st Int'l Conf. on Thermoelectrics, Long Beach, CA (Aug. 2002).
Borissova et al., Thermoelectric properties of materials based on PbTe and GeTe, 1st Eur. Conf. Thermoelec., Cardiff, Sep. 15-17, Chapter 15, pp. 171-177 (1988).
Buist, R., et al. "Theoretical Analysis of Thermoelectric Cooling Performance Enhancement Via Thermal and Electrical Pulsing", Journal of Thermoelectricity, No. 4, 1996.
Buist, R.J.. et al. "A New Concept for Improving Thermoelectric Heat Pump Efficiency", Borg-Warner Thermoelectrics Wolf and Algonquin Road, pp. 60-63, 1976.
Caillat, T. et al.: "Study of the Bi-Sb-Te Ternaru Phase Diagram", J. Phys. Chem. Solids vol. 53, No. 2, pp. 227-232, 1992.
Chinese Office Action for CN App. No. 200680019992.6 dated Nov. 6, 2009.
Choi, J.-S. et al., "Thermoelectric Properties of n-Type (PbI-xGex)Te Fabricated by Hot Pressing Method" Proc. 16th International Conference on Thermoelectrics, 228-231. (1997).
CRC Handbook of Thermoelectrics, ed. D.M. Rowe, Chapter 54, Medium-Scale Cooling: Thermoelectrice Technology and Chap. 55, Modeling of Thermoelectric Cooling Systems, (ISBN: 0-8493-0146-7), Jul. 1995, pp. 667-683.
Database Inspec [Online] the Institution of Electrical Engineers, Stevenage, GB: Aug. 1990, Nemov S.A. et al.,: "Characteristics of the energy spectrum of Pb1-xSnxTe: T1,Na" XP002556259 Database accession No. 3874115 abstract & Soviet Physics—Semiconductors, USA, vol. 24, No. 8, 1990, pp. 873-876, ISSN: 0038-5700.
Database Inspec [Online] The Institution of Electrical Engineers, Stevenage, GB; May 16, 1993, Akimov, B. A., et al.: "Carrier transport and non-equilibrium phenomena in doped PbTe and related materials" XP002556261 Database accession No. 4449842 abstract & Physica Status Solidi A Germany, vol. 137, No. 1, 1993, pp. 9-55, ISSN: 0031-8965.
Database Inspec [Online] The Institution of Electrical Engineers, Stevenage, GB; Aug. 1992, Nemov S. A., et al.: "Self-compensation of electrically active impurities by intrinsic defects in Pb0.8Sn0.2Te solid solutions" XP002556260 Database accession No. 4329503 abstract & Soviet Physics—Semiconductors USA, vol. 26, No. 8, 1992, pp. 839-842, ISSN: 0038-5700.
Database Inspec [Online] The Institution of Electrical Engineers, Stevenage, GB; Oct. 2001, Nemov S. A., et al.: "Density of localized states in (Pb0.78Sn0.22)0.95In0.05Te solid solutions" XP002556258 Database accession No. 7110742 abstract & Semiconductors MAIK Nauka Russia, vol. 35, No. 10, 2001, pp. 1144-1146, ISSN: 1063-7826.
Derwent 2001-426994/46.
Dismukes, J.P. et al.: "Lattice Parameter and Density in Germanium-Silicon Alloys", RCA Laboratories, Radio Corporation of America, Princeton, New Jersey, vol. 68, No. 10, Oct. 1964, pp. 3021-3027.
EPO Examination Report for EPO App. No. 04 726 474.2-1235, dated Nov. 28, 2007 in 6 pages.
Gelbstein Y., et al.: "In-doped Pb0.5Sn0.5Te p-type samples prepared by powder metallurgical processing for thermoelectric applications" Physica B, vol. 396, Jan. 1, 2007 pp. 16-21, XP002554792 figure 11.
Goldsmid, H.J., "Electronic Refrigeration", Pion Ltd, 207 Brondesbury Park, London (1986).
Guéguen, A., et al.: "Thermoelectric Properties and Nanostructuring in the p-Type Materials NaPb18-xSnxMTe20 (M =Sb, Bi)", Chem. Mater. 2009, 21, 1683-1694.
Heremans, et al.: "Thermopower enhancement in PbTe with Pb precipitates", Journal of Applied Physics 98, 063703 (2005).
Hoang, Khang, et al.: "Atomic Ordering and Gap Formation in Ag-Sb-Based Ternary Chalcogenides" Physical Review Letters, American Physical Society, New York, US, vol. 99, No. 15, Oct. 12, 2007 pp. 156403-1, XP007910508 ISSN: 0031-9007.
Hsu, K.F., et al.: "Cubic AgPbmSbTe2+m: bulk thermoelectric materials with high figure of merit" Science, vol. 303, Feb. 6, 2004, pp. 818-821 XP002555879.
Hsu et al.. "Thermoelectric Properties of the cubic AgPb10SbTe12" Mat. Res. Soc. Symp. Proc. vol. 793 © 2004 Materials Research Society, pp. S6.3.1-S6.3.6.
Ikoma, K., et al., "Thermoelectric Module and Generator for Gasoline Engine Vehicles," 17th Int'l Conf. on Thermo-electrics, Nagoya, Japan,pp. 464-467 (1998).
International Preliminary Report on Patentability for PCT/US06/021630 mailed May 9, 2008 in 6 pgs.
International Search Report and Written Opinion for PCT/US2009/030868, dated Dec. 8, 2009.
International Search Report and Written Opinion for PCT/US2009/031875, dated Dec. 10, 2009.
International Search Report for PCT/EP2004/03786 mailed Oct. 18, 2004 in 3 pgs.
International Search Report for PCT/US 02/03654 mailed on Jun. 12, 2002 (completion date May 20, 2002)
International Search Report for PCT/US 02/03659 mailed on Aug. 6, 2002 (completion date Jul. 9, 2002).
International Search Report for PCT/US 02/06285 mailed on Jun. 12, 2002 (completion date May 11, 2002).
International Search Report for PCT/US 02/25233 mailed on Nov. 29, 2002 (completion date Sep. 24, 2002).
International Search Report for PCT/US 03/17834 mailed on Sep. 2, 2003 (completion date Jul. 29, 2003).
International Search Report for PCT/US02/03772 mailed Jul. 11, 2002 (completion date May 29, 2002).
International Search Report for PCT/US03/24899; mailed May 18, 2005 (completion date Apr. 5, 2004).
International Search Report for PCT/US04/026560; dated Nov. 25, 2004.
International Search Report for PCT/US04/026757; mailed Apr. 13, 2005 (completion date Apr. 7, 2005).
International Search Report for PCT/US06/021630 mailed Oct. 25, 2007 in 1 pg.
Japanese Office Action for JP 2008-515793 dated Oct. 2, 2009.
Kohri H., et al., "Improvement of thermoelectric properties for n-type PbTe by adding Ge" Materials Science Forum Trans Tech Publications Switzerland, vol. 423-425, 2003, pp. 381-384, XP008035344.
Lashkaraev G. V., et al., "Hot wall growth and properties of lead telluride films doped by germanium and gallium" Semiconductor Physics Quantum Electronics & Optoelectronics Natl. Acad. Sci. UKR Ukraine, vol. 3, No. 3, Jun. 2000, pp. 295-299, XP002296047 Ukraine ISSN: 1560-8034.
Lawson et al., Preparation and properties of HgTe and mixed crystals of Hg Te-CdTe, Phys. And Chem. Solids, 9, pp. 325-329 (1959) ( 1 page abstract only).
Long, C., et al: "Preparation and thermoelectric properties of N-type PbTe doped with in and PbI2" Rogl, P. F.,: 25th International Conference on Thermoelectrics, Aug. 6-10, 2006 (IEEE Cat. No. 06TH8931C) Piscataway, NJ, USA ISBN 1-4244-0811-3: , Aug. 10, 2006, XP002556257 p. 382-385.
Miner, A., et al. "Thermo-Electro-Mechanical Refrigeration Based on Transient Thermoelectric Effects", Applied Physics letters, vol. 75, pp. 1176-1178 (1999).

Partin, D.L., "Growth of lead-germanium-telluride thin film structures by molecular beam epitaxy" J. Vac. Sci. Technol., 21(1), May/Jun. 1982, p. 1-5.
Poudeu, P. F., et al.: "High temperature figure of merit and naostructuring in bulk p-type NaI-xPbmSbyTem+2" vol. 45, 2006, pp. 3835-3839, XP002555880.
Quarez, Eric et al., "Nanostructuring, Compositional Fluctuations, and Atomic Ordering in the Thermoelectric Materials AgPbmSbTe2+m. The Myth of Solid Solutions" Journal of the American Chemical Society, American Chemical Society, Washington, DC, US, vol. 127, Jan. 1, 2005 pp. 9177-9190, XP007910505 ISSN:0002-7863.
Ravich et al., "Semiconducting Lead Chalcogenides," Chap. IV, Sec. 4.2, pp. 196-213, 1970.
Rogacheva, E. I., et al., "Concentration anomalies of properties in Pb1-xGexTe solid solutions" XP002296049 Database accession No. 4554393 abstract & XXII International School on Physics of Semiconducting Compounds May 22-28, 1993 Jaszowiec, Poland, vol. 84, No. 4, May 22, 1992, pp. 729-732, Acta Physica Polonica A Poland ISSN: 0587-4246 (The Institution of Electrical Engineers, Stevenage, GB; Oct. 1993.
Rosi, F. D., et al.: "Semiconducting materials for thermoelectric power generation" RCA Review, vol. 22, Mar. 1, 1961, pp. 82-121, XP008114961 RCA Corporation, US ISSN: 0033-6831 cited in the application p. 104-p. 110.
Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).
Wernick, Metallurgy of some ternary semiconductors and constitution on the AgSbSe2-AgSbTe2-AgBiSe-PbSe-PbTe system, Bell Telephone Laboratories, Inc., Murray Hill, New Jersey, pp. 69-88 (1960).
Wood, C., et al.. "Review Article; Materials for thermoelectric energy conversion" Reports on Progress in Physics, Institute of Physics Publishing, Bristol, GB, vol. 51, No. 4, Apr. 1, 1988 pp. 459-539, XP020024916 ISSN: 0034-4885 pp. 496,499; figure 18.
Akimov, B. A., et al.: "Carrier Transport and Non-Equilibrium Phenomena in Doped PbTe and Related Materials" Review Article, Department of Low Temperature Physics, Faculty of Physics, M.V. Lomonossov Moscow State University, phys. stat. sol. (a) 127, 9 (1993) (pp. 9-55).
Armstrong, R. W., et al.: "A Structural Study of the Compound AgSbTe2", Journal of Applied Physics, vol. 31, No. 11, Nov. 1960, pp. 1954-1959.
Bazakutsa, V. A., et al.: "Thermal Conductivity of Triple Semiconductors of $A1SbC^6_2$ Type as a Function of Chemical Composition and Structure", J. Eng. Phys. 34, 127-140 (1978).
Bell, L. E.: "Alternate Thermoelectric Thermodynamic Cycles with Improved Power Generation Efficiencies", Proceedings ICT '03, 22nd International Conference on Thermoelectrics, La Grande Motte, France, Aug. 17-21, 2003.
Bushmarina, G. S., et al.: "Stabilization of the Fermi level in gallium-doped $Pb_{1-x}$ $Ge_x$Te solid solutions", Sov. Phys. Semicond. 11(10), Oct. 1977, American Institute of Physics 1978, pp. 1098-1102.
Darrow, M.S., et al.: "Phase Relations in the System PBS-PbTe", Transactions of the Metallurgical Society of AIME, 654-vol. 236, May 1996.
Geller, S., et al.: "Ternary Semiconducting Compounds with Sodium Chloride-Like Structure: $AgSbSe_2$, $AgSbTe_2$, $AgBiSe_2$, $AgBiSe_2$", Ternary Semiconducting Compounds, Acta Cryst. (1959) 12, pp. 46-54.
Golubev, V. G., et al.: "Electrical properties of Pb1-xlnxTe solid solutions at liquid helium temperature", Sov. Phys. Semicond. 11(9) Sep. 1977, American Institute of Physics 1978, pp. 1001-1003.
Goodman, C.H.L., et al.: "New Semiconducting Compounds of Diamond Type Structure", Research Laboratories The General Electric Co. Ltd., Wembley, Middlesex, England, Physica XX, No. 11, Amsterdam Conference Semiconductors (1954) pp. 1107-1109.
Heremans, J. P., et al.: "Enhancement of Thermoelectric Efficiency in PbTe by Distortion of the Electric Density of States", Science 321, 554 (2008), in six pages.

Hockings, E.F.: "The thermal conductivity of silver antimony telluride", Letters to the Editors, 1959, pp. 341-342.
Japanese Office Action for JP 2008-515793 dated Apr. 9, 2010.
Jaworski, C.M., et al.: "Resonant level formed by tin in Bi2Te3 and the enhancement of room-temperature thermoelectric power", Physical Review B 80, 233201 (2009), pp. 1-4.
Jovovic, V., et al.: High-Temperature Themoelectric Properties of $Pb_{1-x}Sn_xTe$:In, Mater. Res. Soc. Symp. Proc. vol. 1044, 2008.
Jovovic, V., et al.: "Low temperature thermal, thermoelectric and thermomagnetic transport in indium rich Pb1-xSnxTe alloys", The Ohio State University, Columbus, OH 43210, USA, J. of Applied Physics (103) 053710 (2008), in 7 pages.
Kaĭdanov, V. I., et al.: "Deep and resonance states in AIVBVI semiconductors", Sov. Phys. Usp. 28(1), Jan. 1985, American Institute of Physics 1985, pp. 31-53.
Kaĭdanov, V. I., et al.: "Influence of resonant scattering of carriers on the transport coefficients in the absence of a magnetic field", Sov. Phys. Semicond. 20(6), Jun. 1986, American Institute of Physics 1986, pp. 693-694.
Kaĭdanov, V. I., et al.: "New quasilocal level in PbTe:TI containing excess lead", Sov. Phys. Semicond. 20(5), May 1986, American Institute of Physics 1986, pp. 541-543.
Kaĭdanov, V. I., et al.: "Resonant scattering of carriers in IV-VI semiconductors", Sov. Phys. Semicond. 26(2), Feb. 1992, American Institute of Physics 1992, pp. 113-125.
Kohler, H.: "Non-Parabolicity of the Highest Valence Band of $Bi_2Te_3$ from Shubnikov-de Haas Effect". Physikalisches Institut der Universtat Wurzburg, phys. stat. sol (b) 74, 591 (1976) pp. 591-600.
Kulbachinskii, V. A., et al.: "Thermoelectric Power and Scattering of Carriers in Bi2—xSnxTe3 with Layered Structure", phys. Stat. sol. (b) 199, 505 (1997).
Kulbachinskii, V. A., et al.: "Valence-band energy spectrum of solid solutions of narrow-gap-semiconductor Bi2-xSxTe3 single crystals", Physical Review B, vol. 50, No. 23, Dec. 15, 1994, pp. 16921-16930.
Mahan, G. D., et al.: "The best thermoelectric", Proc. Natl. Acad. Sci. USA, vol. 93, pp. 7436-7439, Applied Physical Sciences, Jul. 1996.
Middendorf von, A., et al.: "Evidence for a Second Valence Band in p-Type Bi2 Te3 From Magneto-Seebeck and Shubnikov-De Haas-Data", Physikalisches Institut der universität Würzburg, Würzburg, Germany, Mar. 30, 1972, in five pages.
Miyajima, N., et al.: "Possible Mechanism of a New Type of Three-Dimensional Quantized Hall Effect in Layered Semiconductors Bi2-xSnxTe3", Journal of Low Temperature Physics, Vo. 123, Nos. ¾, 2001, pp. 219-238.
Morelli, et al., "Intrinsically Minimal Thermal Conductivity in Cubic I-V-$VI_2$ Semiconductors", Physical Review Letters, PRL 101, 035901, 2008, in 4 pages.
Nemov, S. A. et al.: "Density of Localized States in (Pb0.78Sn 0.22) 0.95In0.05Te Solid Solutions", Electronic and Optical Properties of Semiconductors, Semiconductors, vol. 35, No. 10, 2001, pp. 1144-1146.
Nemov, S. A., et al.: "Characteristics of the energy spectrum of Pb1-xSnx Te:Tl:Na" M. I. Jalinin Polytechnic Institute Leningrad, Sov. Phys. Semicond. 24(8), Aug. 1990, pp. 873-876.
Nemov, S. A., et al.: "Self-compensation of electrically active impurities by intrinsic defects in (Pb0.8Sn0.2) Te solid solutions" State Technical University, St. Petersburg, A.F. Ioffe Physicotechnical Institute, Russian Academy of Sciences, St. Petersburg, Sov. Phys. Semicond. 26(8), Aug. 1992, pp. 839-842.
Nemov, S. A., et al.: "Transport phenomena in Pb0.78Sn0.22Te with high in impurity concentrations", Semiconductors 27(2), Feb. 1993, American Institute of Physics, 1993, pp. 165-168.
Plecháček, T., et al.: "Defect structure of Pb-doped Bi2Te3 single crystals", Philosophical Magazine, vol. 84, No. 21, Jul. 21, 2004, pp. 2217-2227.
Ravich, Y. I., et al.: "Selective Carrier Scattering in Thermoelectric Materials", General Principles and Theoretical Considerations, CRC Press, Inc. pp. 67-73, 1995.
Scherrer, H., et al.: "Thermoelectric Materials", Bismuth Telluride, Antimony Telluride, and Their Solid Solutions, Chapter 19, pp. 211-255, 1995.

Shoemake, G. E., et al.: "Specific Heat of n- and p-Type Bi2Te3 from 1.4 to 90°K*", Physical Review, vol. 185, No. 3, Sep. 15, 1969, pp. 1046-1056.

Veïs, A. N., et al.: "Investigation of the impurity states of thallium lead selenide", Sov. Phys. Semicond., vol. 11, No. 5, May 1977, American Institute of Physics, 1977, pp. 588-589.

Volkov, B. A., et al.: "Mixed-valence impurities in lead telluride-based solid solutions", Physics-Uspekhi 45 (8) 819-846 (2002), Uspekhi Fizicheskikh Nauk, Russian Academy of Sciences, 2002.

Wernick, J. H., et al.: "New semiconducting ternary compounds", Phys. Chem. Solids 3, Letters to the Editor, 1957, pp. 157-159.

Wolfe, R., et al.: "Anomalous Hall Effect in AgSbTe2", Journal of Applied Physics, vol. 31, No. 11, Nov. 1960, pp. 1959-1964.

Zhitinskaya, M. K., et al.: "Influence of Sn Resonance States on the Electrical Homogeneity of Bi2Te3 Single Crystals", Semiconductors, vol. 34, No. 12, 2000, pp. 1363-1364.

Zhitinskaya, M. K., et al.: "Properties of the Electron and Phonon Sub-systems of Tin-doped Bismuth Telluride-based Solid Solutions", 7th European Workshop on Thermoelectrics, 2002, Pamplona, Spain, 5 pages.

Zhitinskaya, M. K., et al.: "Specific features of Bi2Te3 doping with Sn", Physics of the Solid State, vol. 40, No. 8, Aug. 1998, pp. 1297-1300.

Zhitinskaya, M. K., et al.: "Thermal Conductivity of Bi2Te3 : Sn and the Effect of Codoping by Pb and I Atoms", Physics of the Solid State, vol. 45, No. 7, pp. 1251-1253, 2003.

Zhuze, V. P., et al.: "Semiconducting Compounds With The General Formula ABX2", Soviet Physics, Technical Physics, vol. 3, No. 10, Oct. 1958, pp. 1925-1938.

Дудкин,Л. Ц., et al.: "ТРОЙНыЕПОЛУПРОВОДН ИКОВыЕДИНЕНИЯA1BvBv21",

ДокладыАкадемииНаук СССР, 1959, Том 124, No. 1, pp. 94-97.

Akimov, B. A., et al.: "Carrier Transport and Non-Equilibrium Phenomena in Doped PbTe and Related Materials" Review Article, Department of Low Temperature Physics, Faculty of Physics, M.V. Lomonossov Moscow State University, phys. stat. sol. (a) 127, 9 (1993) (pp. 9-55).

Armstrong, R. W., et al.: "A Structural Study of the Compound AgSbTe2", Journal of Applied Physics, vol. 31, No. 11, Nov. 1960, pp. 1954 -1959.

Bazakutsa, V. A., et al.: "Thermal Conductivity of Triple Semiconductors of A1SbC$^6$$_2$ Type as a Function of Chemical Composition and Structure", J. Eng. Phys. 34, 127-140 (1978).

Bell, L. E.: "Alternate Thermoelectric Thermodynamic Cycles with Improved Power Generation Efficiencies", Proceedings ICT '03, 22nd International Conference on Thermoelectrics, La Grande Motte, France, Aug. 17-21, 2003.

Bergmann, V. G.: "Untersuchungen Ober die Dotierungseigenschaften der Elemente Germanium und Blei in Wismuttellurid Bi2Te3*", Z. Ruer Naturforsch, vol. 18a, Issue 11, 1963, pp. 1169 - 1181.

Bushmarina, G. S., et al.: "Stabilization of the Fermi level in gallium-doped Pb$_{1-x}$Ge$_x$Te solid solutions", Sov. Phys. Semicond. 11(10), Oct. 1977, American Institute of Physics 1978, pp. 1098 - 1102.

Darrow, M.S., et al.: "Phase Relations in the System PBS-PbTe", Transactions of the Metallurgical Society of AIME, 654-vol. 236, May 1996.

Fleischmann, V. H., et al.: "Halbleitende Mischkristalle vom Typ", Z. Naturforschg. 14a, 999-1000 (1959); eingeg. am 8. Oktober 1959).

Fleischmann, V. H., et al.: "Neuere Untersüchungen an halbleitenden IV VI-IV VI2-Mischkristallen", Z. Naturforschg. JBa, 646-649 (1963); eingegangen am 9. März 1963).

Geller, S., et al.: "Ternary Semiconducting Compounds with Sodium Chloride-Like Structure: AgSbSe$_2$, AgSbTe$_2$, AgBiS$_2$, AgBiSe$_2$", Ternary Semiconducting Compounds, Acta Cryst. (1959) 12, pp. 46 - 54.

Golubev, V. G., et al.: "Electrical properties of Pb1-xInxTe solid solutions at liquid helium temperature", Sov. Phys. Semicond. 11(9) Sep. 1977, American Institute of Physics 1978, pp. 1001 -1003.

Goodman, C.H.L., et al.: "New Semiconducting Compounds of Diamond Type Structure", Research Laboratories the General Electric Co. Ltd., Wembley, Middlesex, England, Physica XX, No. 11, Amsterdam Conference Semiconductors (1954) pp. 1107 - 1109.

Heremans, J. P., et al.: "Enhancement of Thermoelectric Efficiency in PbTe by Distortion of the Electric Density of States", Science 321, 554 (2008), in six pages.

Hockings, E.F.: "The thermal conductivity of silver antimony telluride", Letters to the Editors, 1959, pp. 341-342.

Japanese Office Action for JP 2008-515793 dated Apr. 9, 2010.

Jaworski, C.M., et al.: "Resonant level formed by tin in Bi2Te3 and the enhancement of room-temperature thermoelectric power", Physical Review B 80, 233201 (2009), pp. 1-4.

Jovovic, V., et al.: High-Temperature Thermoelectric Properties of Pb$_{1-x}$Te:In, Mater. Res. Soc. Symp. Proc. vol. 1044, 2008.

Jovovic, V., et al.: "Low temperature thermal, thermoelectric and thermomagnetic transport in indium rich Pb1-xSnxTe alloys", The Ohio State University, Columbus, OH 43210, USA, J. of Applied Physics (103) 053710 (2008), in 7 pages.

* cited by examiner

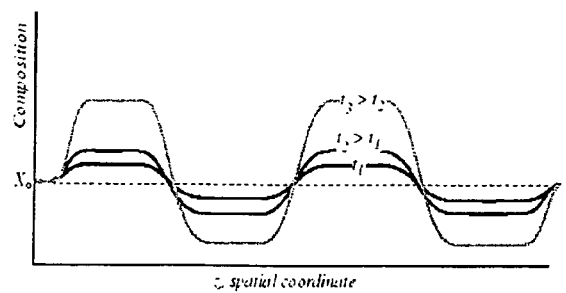
Figure 2B
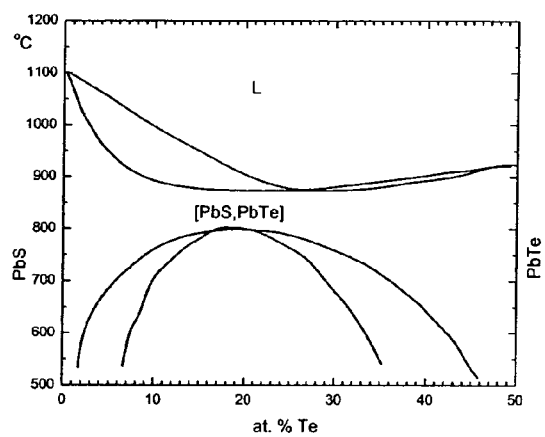
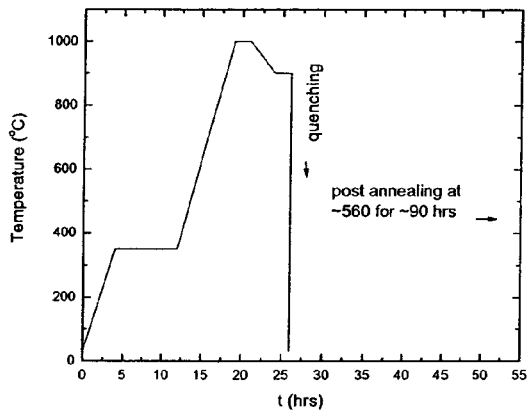
FIGURE 3A                    FIGURE 3B

PbTe-Sb(2%) Bright Field Image

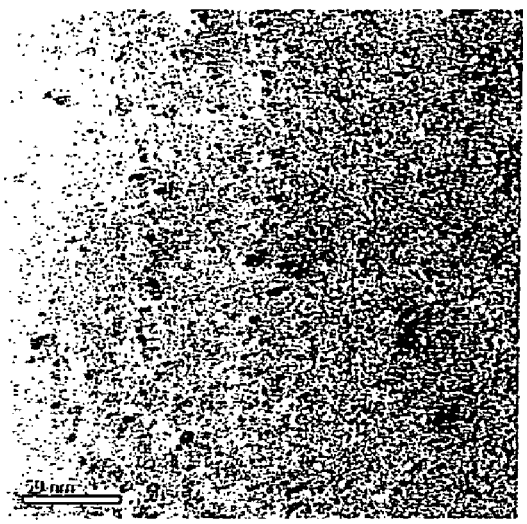
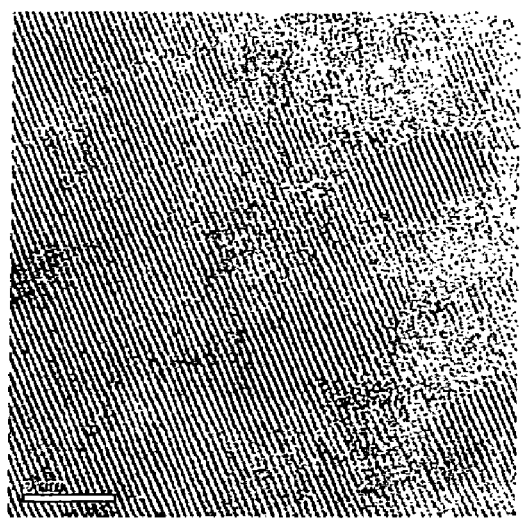
FIGURE 7A                    FIGURE 7B
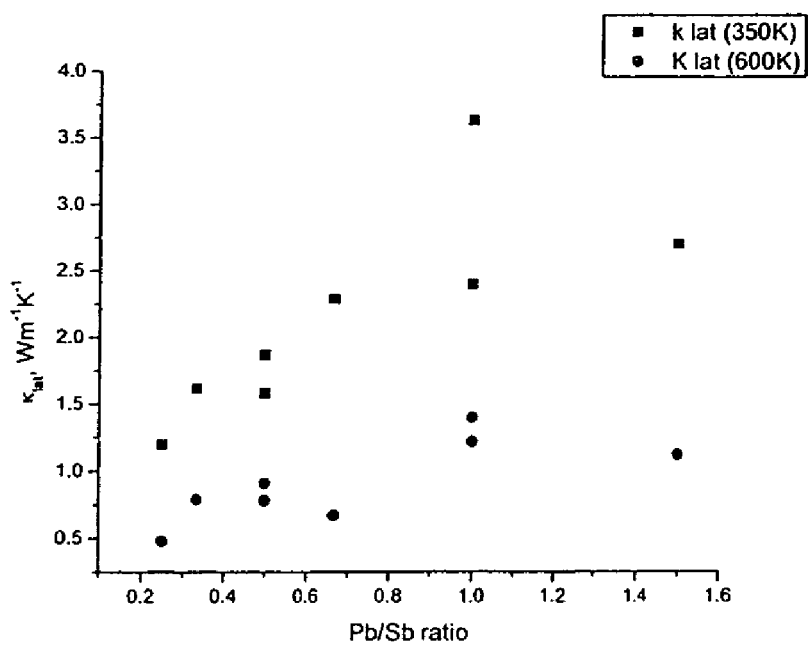
FIGURE 8

US 7,847,179 B2

THERMOELECTRIC COMPOSITIONS AND PROCESS

CROSS-REFERENCE TO RELATED APPLICATIONS

This application claims priority to provisional application Ser. No. 60/687,769 filed Jun. 6, 2005.

STATEMENT REGARDING FEDERALLY SPONSORED RESEARCH OR DEVELOPMENT

Not Applicable

STATEMENT REGARDING GOVERNMENT RIGHTS

Not Applicable

BACKGROUND OF THE INVENTION (1) Field of the Invention

The present invention relates to a process for producing novel bulk thermoelectric compositions with nanoscale inclusions which enhance the figure of merit (ZT). In particular, the present invention relates to thermoelectric compositions wherein the nanoscale inclusions are visible by conventional nanoscale imaging techniques such as transmission electron microscopy (TEM) imaging. They are useful for power generation and heat pumps.

(2) Description of the Related Art

The prior art in thermoelectric materials and devices is generally described in U.S. Pat. No. 5,448,109 to Cauchy, U.S. Pat. No. 6,312,617 to Kanatzidis et al, as well as published application 2004/0200519 A1 to Sterzel et al and 2005/0076944 A1 to Kanatzidis et al. Each of these references is concerned with increasing the figure of merit (ZT) which is directly influenced by the product of electrical conductivity and the square of the thermopower divided by the thermal conductivity. Generally as the electrical conductivity of a thermoelectric material is increased, the thermal conductivity is increased. The efficiency of the thermoelectric device is less than theoretical and may not be sufficiently efficient for commercial purposes.

OBJECTS

It is therefore an object of the present invention to provide relatively efficient bulk thermoelectric materials. Further, it is an object of the present invention to provide a process for the preparation of these thermoelectric materials. Further, it is an object of the present invention to provide thermoelectric materials which are relatively economical to prepare compared to artificial deposited superlattice thin film thermoelectric materials. These and other objects will become increasingly apparent by reference to the following description and the drawings.

SUMMARY OF THE INVENTION

The present invention relates to a thermoelectric composition which comprises: a homogenous solid solution or compound of a first chalcogenide providing a matrix with nanoscale inclusions of a second phase which has a different composition wherein a figure of merit (ZT) of the composition is greater than that without the inclusions. Preferably the inclusion has been formed by spinodal decomposition as a result of annealing the composition at an appropriate temperature less than a melting point of the homogenous solid solution based upon a phase diagram. Preferably the inclusion has been formed by matrix encapsulation as a result of doping of a molten solution of the matrix. Preferably the inclusion has been formed by nucleation and growth of the inclusion by cooling a molten solution of the matrix.

The present invention also relates to a thermoelectric composition which comprises a homogenous solid solution or compound of a chalcogenide comprising a uniform precipitated dispersion of nano particles of at least two different metal chalcogenides wherein the chalcogen is selected from the group consisting of tellurium, sulfur and selenium. Preferably the composition has been formed by spinodal decomposition of the solid solution.

The present invention also relates to a thermoelectric composition which comprises a homogenous solid solution or compound of a chalcogenide with dispersed nano particles derived from a metal or a semiconductor which have been added to the chalcogenide.

The present invention also relates to a thermoelectric composition which comprises a homogenous solid solution or compound of a chalcogenide which has been annealed at a temperature which allows the formation of nano particles having a different composition than the solid solution or compound.

Further, the present invention relates to a composition wherein the inclusion has been formed by matrix encapsulation as a result of doping of a molten solution of the matrix.

Still further, the present invention relates to a composition wherein the inclusion has been formed by nucleation and growth of the inclusion by cooling a molten solution of the matrix.

The present invention further relates to a process for preparing a thermoelectric composition which comprises:

(a) forming a liquid solution or compound of a first chalcogenide and a second phase which has a different composition;

(b) cooling the solution rapidly so that a solid solution of the first chalcogenide as a matrix and the second phase as a nanoscale inclusion is formed, so that the figure of merit is greater than without the inclusions. Preferably the inclusion is formed by spinodal decomposition as a result of annealing the composition at an appropriate temperature less than a melting point of the homogenous solid solution based upon a phase diagram. Preferably the inclusion is formed by matrix encapsulation as a result of cooling a molten solution of the matrix. Preferably the inclusion is formed by nucleation and growth of the inclusion in a supersaturated solid solution of the matrix. Preferably the chalcogenides are of a chalcogen selected from the group consisting of tellurium, sulfur and selenium. Preferably the inclusions are between about 1 and 200 nanometers.

The substance and advantages of the present invention will become increasingly apparent by reference to the following drawings and the description.

BRIEF DESCRIPTION OF DRAWINGS

FIG. 2B is a diagram showing the spatial difference in the composition of the phases.

3C and 3D are high resolution TEM images of a PbTe—PbS 16% spinodally decomposed system.

Figure 4A:
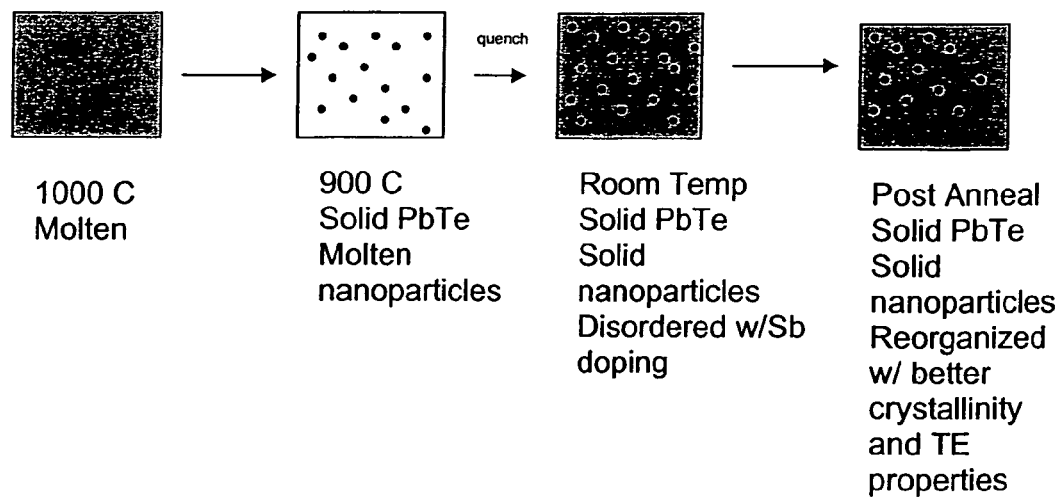
Figure 4B:
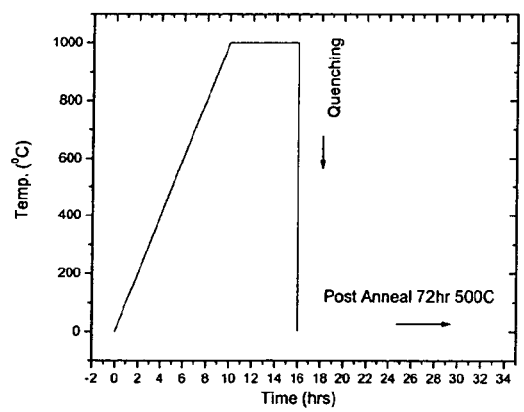
Figure 4C:
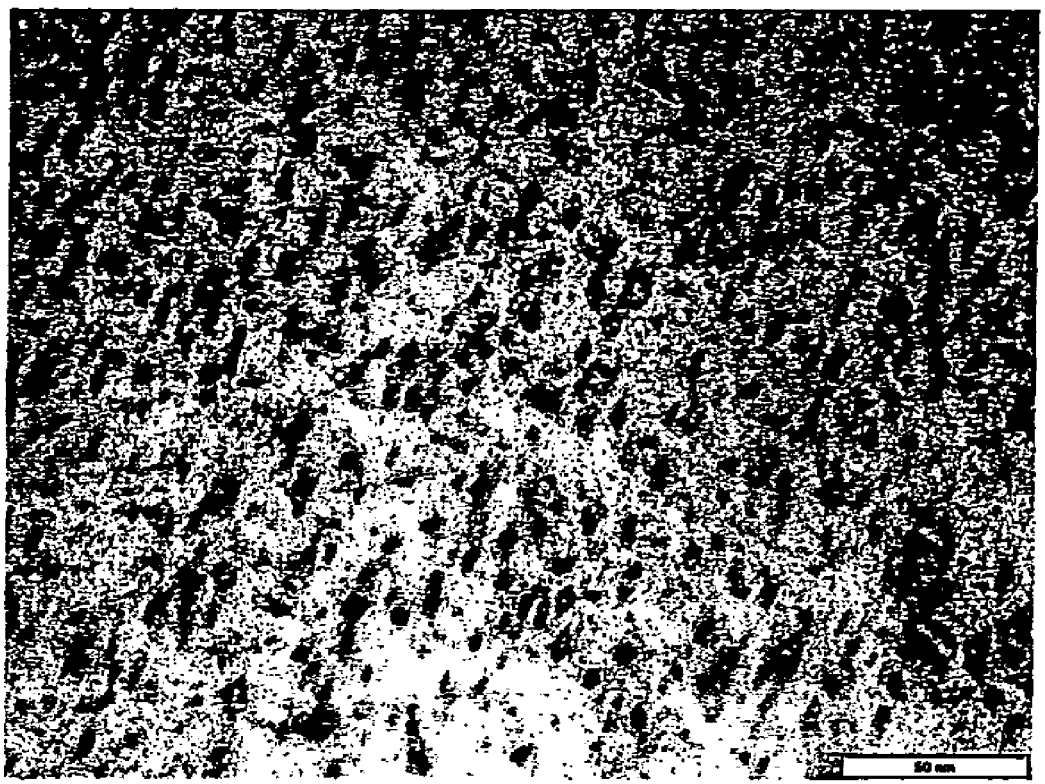
Figure 4D:
Figure 4E:
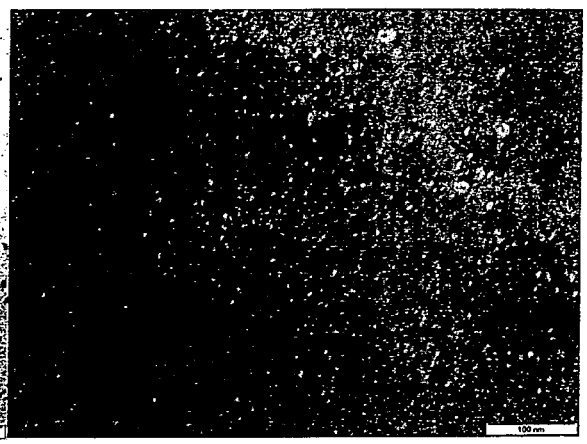
Figure 4F:
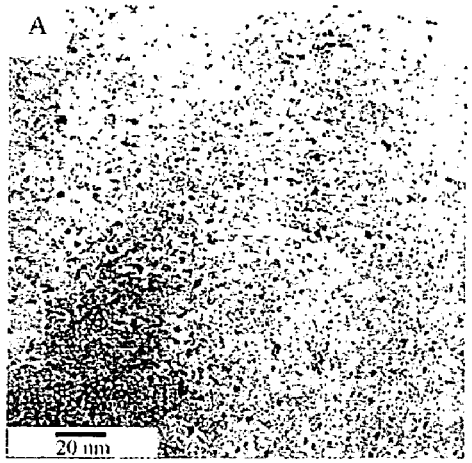
Figure 4G:
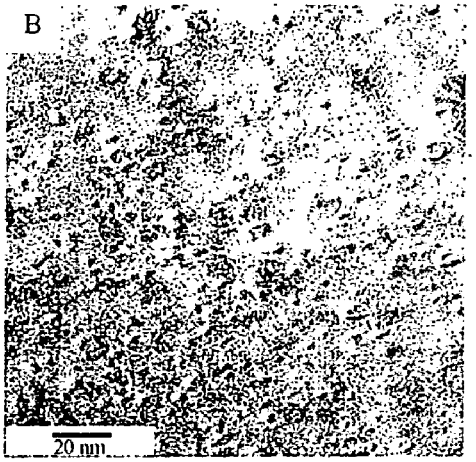
Figure 4H:
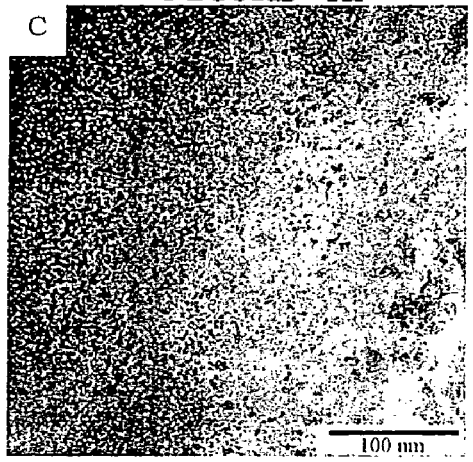
Figure 4I:
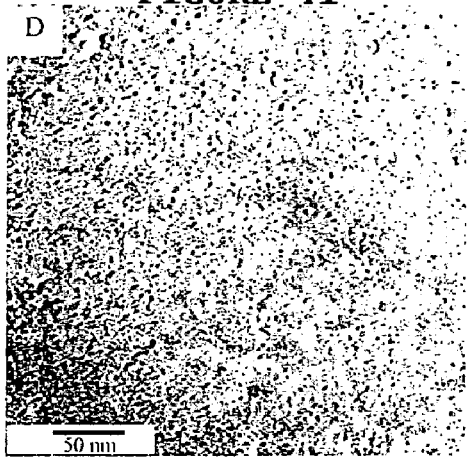
Figure 4J:
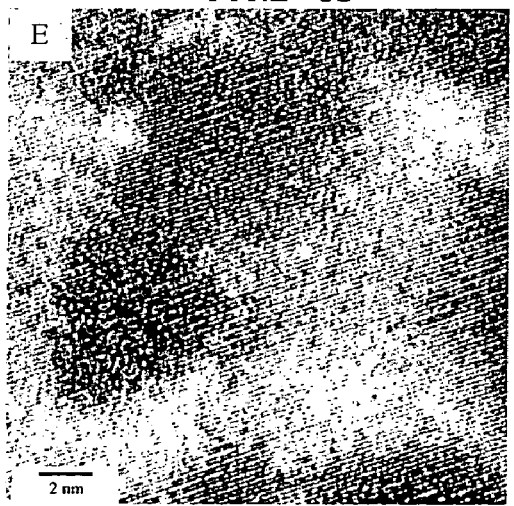
Figure 4K:
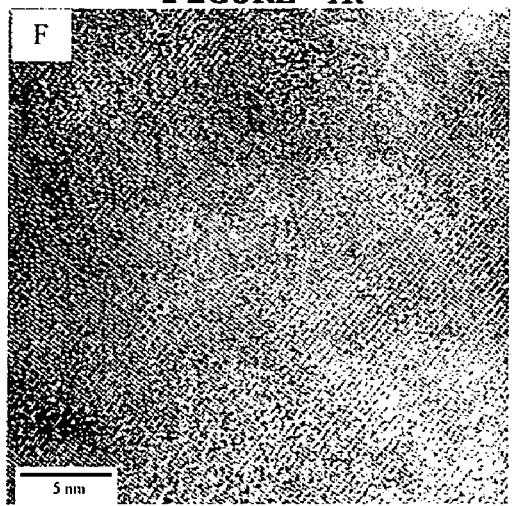
Figure 4L:
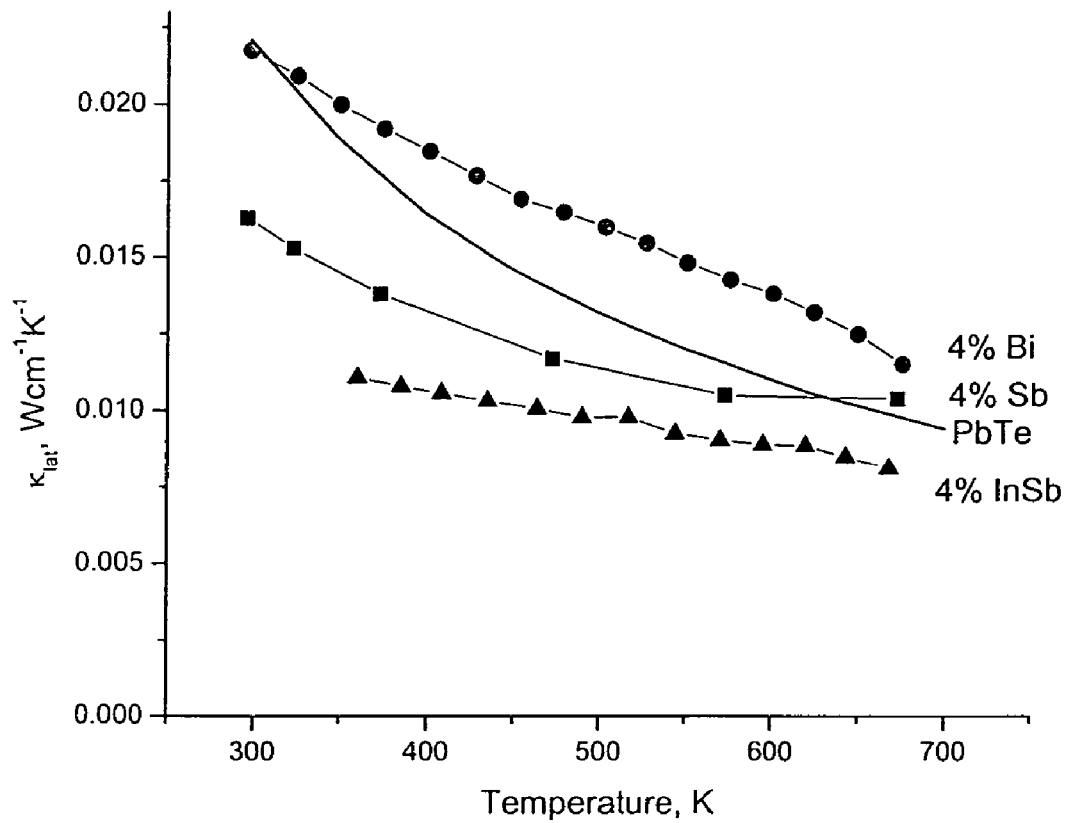

FIG. 4A is a schematic of the matrix encapsulation. FIG. 4B is a graph of a PbTe—Sb heating profile. FIG. 4C is a PbTe—Sb(2%) Bright Field Image. FIGS. 4D and 4E are corresponding Bright and Dark Field TEM images of PbTe—InSb(2%). FIGS. 4F to 4K are transmission electron micrographs showing dispersed nanoparticles of Sb within a crystalline matrix of PbTe. Similar size, shape, and volume fraction are observed for (A) PbTe—Sb (2%) (B) PbTe—Sb (4%) (C) PbTe—Sb (8%) and (D) PbTe—Sb (16%). Because the 8 and 16% samples contain distinct Sb regions the images shown in FIGS. 4C and 4D are from the PbTe rich region. FIG. 4E is a high resolution transmission electron micrograph showing several nanoprecipitates of Sb coherently embedded within the matrix of PbTe. Embedded particles help to maintain high electron mobility while serving as a site for phonon scattering to reduce the thermal conductivity. FIG. 4F is a high resolution micrograph of the PbTe–Bi (4%) system also showing embedded particles in the PbTe matrix. FIG. 4L is a graph showing thermal conductivity as a function of temperature.

Figure 5A:
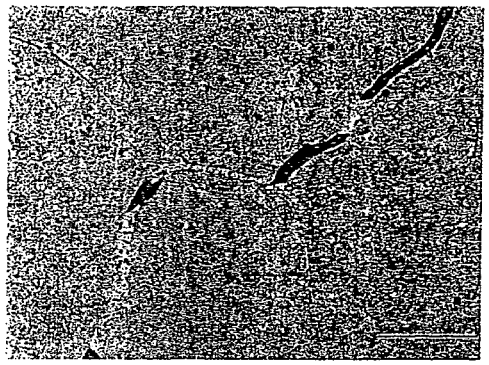
Figure 5B:
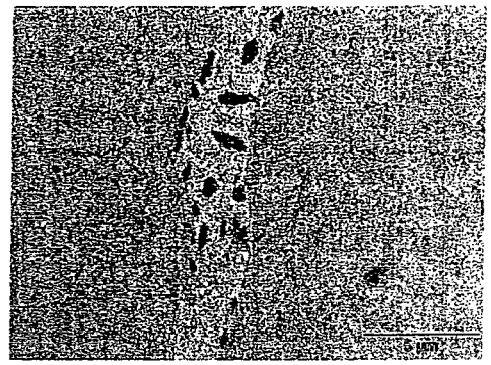

FIGS. 5A and 5B are scanning electron micrographs of PbTe+Pb (2%)+Sb(3%). Large regions or ribbons, several hundred microns in length, composed of a Pb—Sb eutectic appear throughout the sample. Similar microstructure is observed for other samples with similar composition.

Figure 6A:
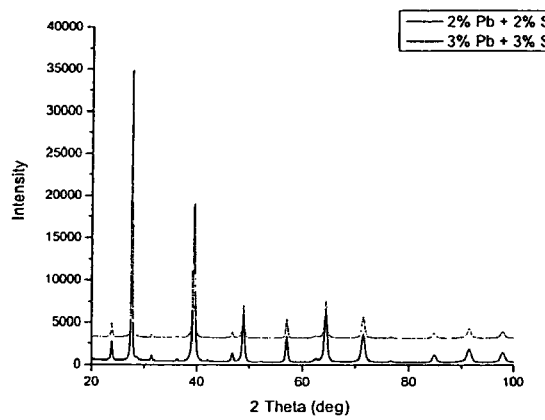
Figure 6B:
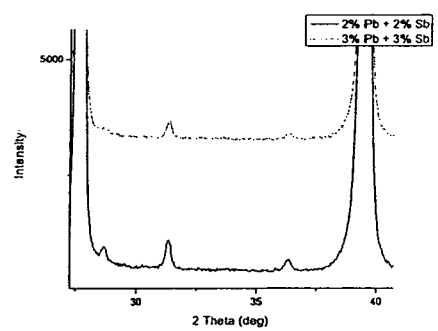

FIGS. 6A and 6B show powder x-ray diffraction clearly indicating additional phases of Pb and Sb as revealed by the magnified inset between 25 and 40 degrees. The peak at ~29 deg corresponds to elemental Sb while the peaks at 31 and 36 deg. can be indexed according to elemental Pb.

FIGS. 7A and 7B show (7A) low magnification transmission electron micrographs showing dispersed particles of Pb and Sb within the PbTe matrix. FIG. 7B shows high magnification TEM micrographs showing the particles appear coherently embedded in the matrix.

FIG. 8 is a graph showing lattice thermal conductivity as a function of Pb/Sb ratio at 350K and 600K. A strong linear dependence of the lattice thermal conductivity is observed as the ratio is varied.

Figure 9A:
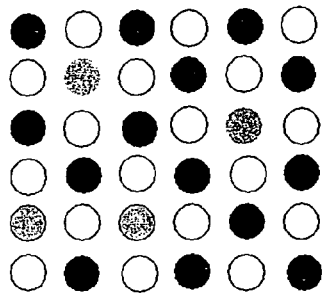
Figure 9B:
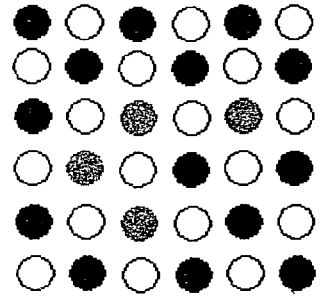
Figure 9C:
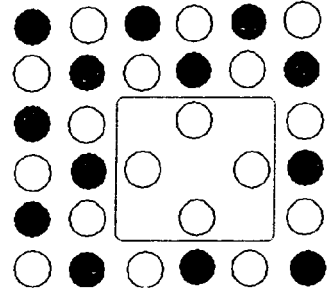
Figure 9D:
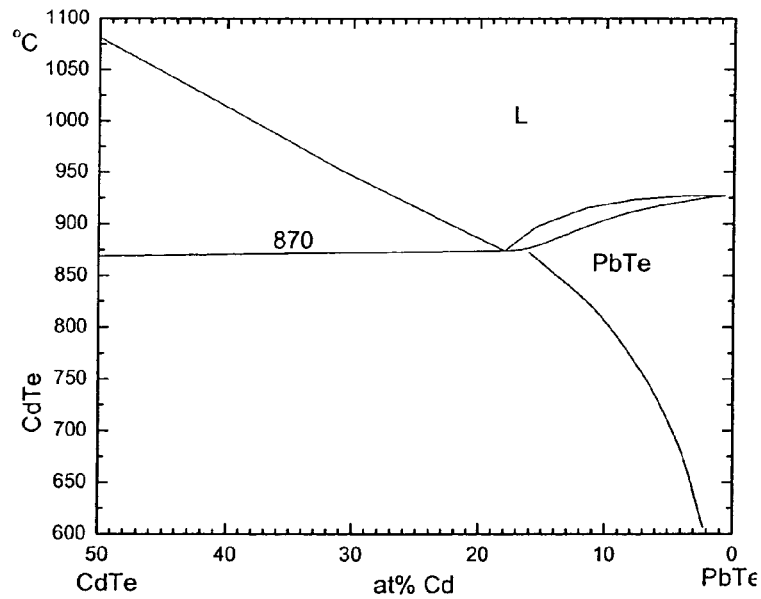
Figure 9E:
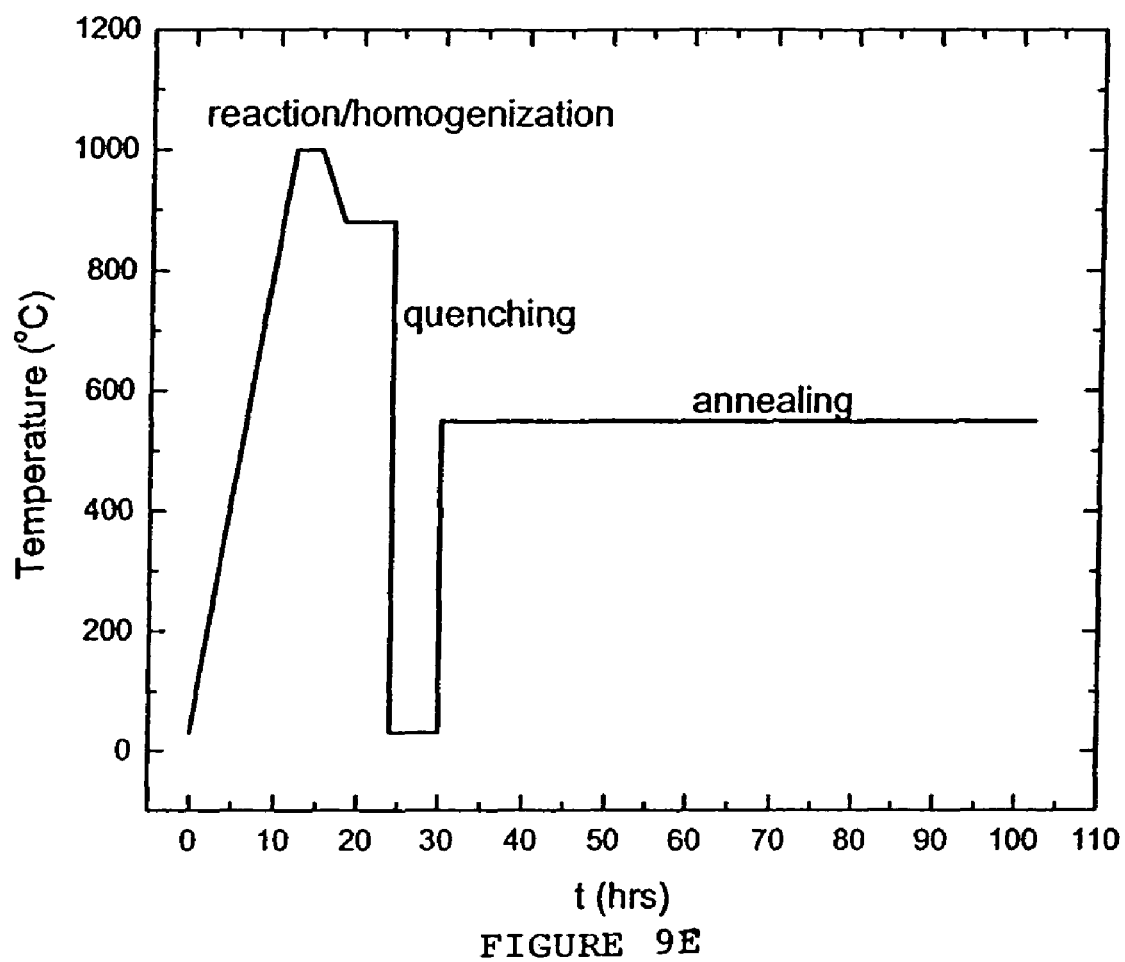
Figures 9F, 9G:
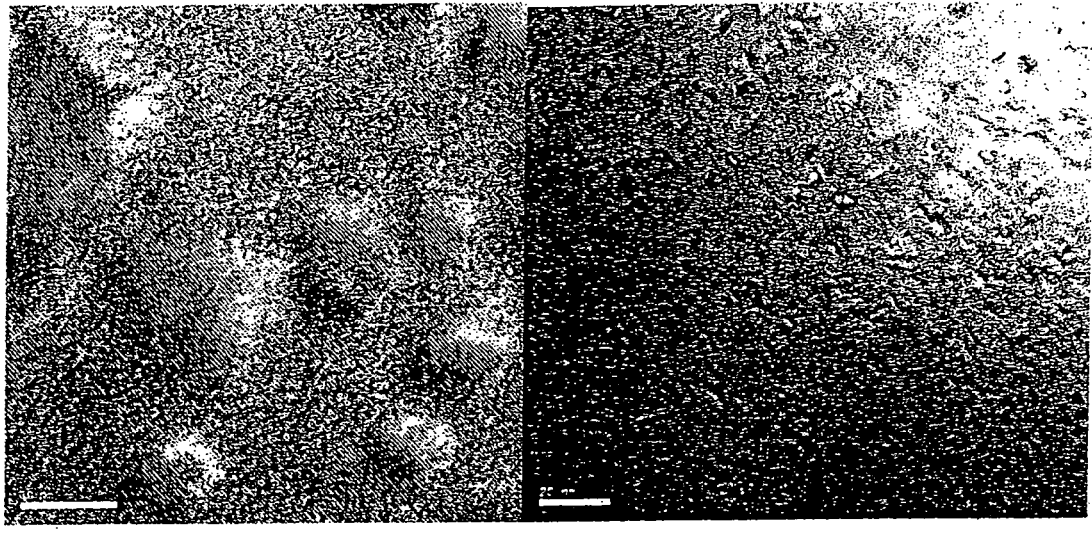
Figures 9H, 9I:
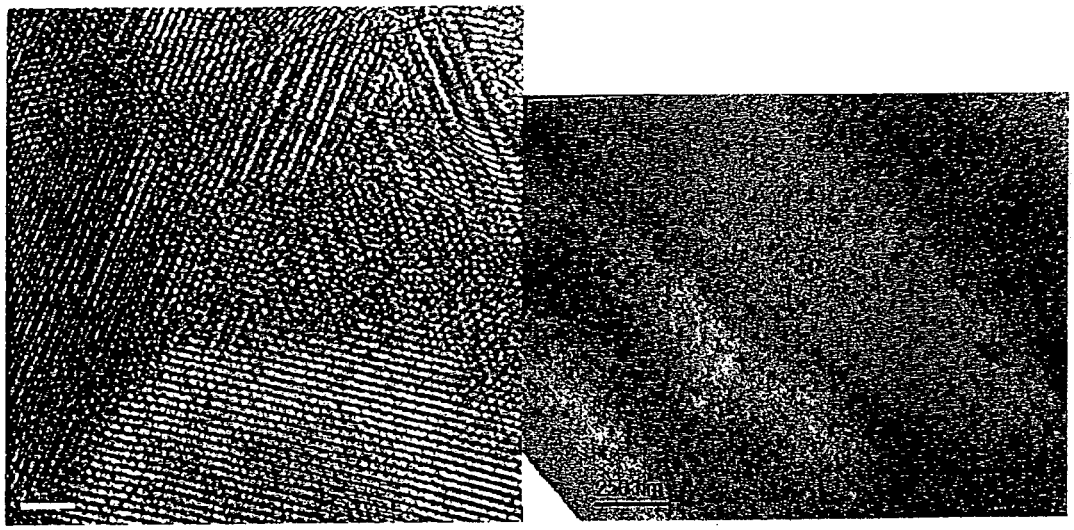

FIG. 9A is a schematic diagram of supersaturated solid solution produced through quenching. FIG. 9B is a schematic diagram of a post annealing within the two phase region of the phase diagram which initiates the coalescence of the second phase into ordered nano-precipitates. FIG. 9C is a schematic diagram of a coherent nano-particle which has been formed. FIG. 9D is a PbTe—CdTe phase diagram. FIG. 9E is a graph of PbTe—CdTe x % reaction and post annealing profile for $2 \leq x \leq 9$. FIGS. 9F and 9G are TEM images of PbS—PbTe6%, and FIGS. 9H and 9I are TEM images of PbTe—CdTe9%.

DESCRIPTION OF THE PREFERRED EMBODIMENTS

The bulk materials containing nanometer-sized inclusions provide enhanced thermoelectric properties. The thermoelectric figure of merit is improved by reducing the thermal conductivity while maintaining or increasing the electrical conductivity and the Seebeck coefficient. Coherent nanometer sized inclusions in a matrix can serve as sites for scattering of phonons that subsequently lower the thermal conductivity. The inclusions are preferably 1 to 200 nanometers. General methods for preparation of these materials have been developed.

The thermoelectric heat to electricity converters will play a key role in future energy conservation, management, and utilization. Thermoelectric coolers also play an important role in electronics and other industries. More efficient thermoelectric materials need to be identified in order to extend their use in power generation and cooling applications.

As previously noted, the measure used to determine the quality of a thermoelectric material is the dimensionless figure of merit ZT, where $ZT=(\sigma S^2/\kappa)T$, where $\sigma$ is the electrical conductivity, S the Seebeck coefficient or the absolute thermopower, T is the temperature and $\kappa$ is the thermal conductivity. The quantity $\sigma.S^2$ is called the power factor. The goal is then to simultaneously improve the thermopower, electrical conductivity (i.e. the power factor), and reduce the thermal conductivity thereby raising ZT. The aforementioned properties are intimately related.

PbTe and Si/Ge alloys are the current thermoelectric materials used for power generation. These compounds once doped possess a maximum ZT of approximately 0.8 at 600 K and 1200 K respectively. By lowering the thermal conductivity of these materials the ZT can be improved without sacrificing the properties already known. Currently $Bi_2Te_3$ and its alloys with $Bi_2Se_3$ and $Sb_2Te_3$, along with alloys of Bi and Sb, are considered the state of the art in terms of thermoelectric cooling materials. These materials have been modified in many ways chemically in order to optimize their performance, however significant improvements can be made to enhance the properties of the currently used thermoelectric materials.

Increasing the efficiency of a thermoelectric material usually involves raising the scattering rate of phonons while at the same time maintaining high carrier mobility. In this respect, it has been demonstrated that thin-film superlattice materials have enhanced ZT that can be explained by the decrease in the thermal conductivity. A supperlattice structure creates de facto a complex arrangement of structural interfaces which in effect raises the thermal resistance of propagating phonons. On the other hand, lattice-matching and coherence of the interfaces ensures undisturbed electron flow thus maintaining a high mobility. This decoupling of electrical and lattice thermal conductivity is necessary to reduce the total thermal conductivity without sacrificing the electrical conductivity.

The drawbacks of superlattice thin films are that they are expensive to prepare, difficult to grow, and will not easily support a large temperature difference across the material. It is thus desirable to incorporate inclusions on the nanometer length scale into a bulk material that is low cost, easy to manufacture, and can support a temperature gradient easily.

In the present invention, three methods have been employed in the production of the desired nanocomposite material for thermoelectric material fabrication. Each of these methods are discussed in detail in the following sections along with an example, Transmission Electron Microscope (TEM) images, and a table of materials systems that can be produced from each general method. The first, spinodal decomposition, has been used to create a material with compositional fluctuations on the nanometer length scale. The other two methods, matrix encapsulation and nucleation and growth, have shown the ability to produce inclusions of various materials inside a host matrix.

Phonon mean free paths, $l_{ph}$, in semiconducting crystals are in the range $1 \leq l_{ph} \leq 100$ nm with a tendency to decrease with increasing temperatures. Realization of nano-composite thermoelectric materials offer a way of introducing nanometer sized scatterers that can greatly suppress the lattice thermal conductivity through phonon scattering. The existence of a wide particle size distribution offers the possibility of scattering a wider range of the phononic spectrum.

Figure 1:
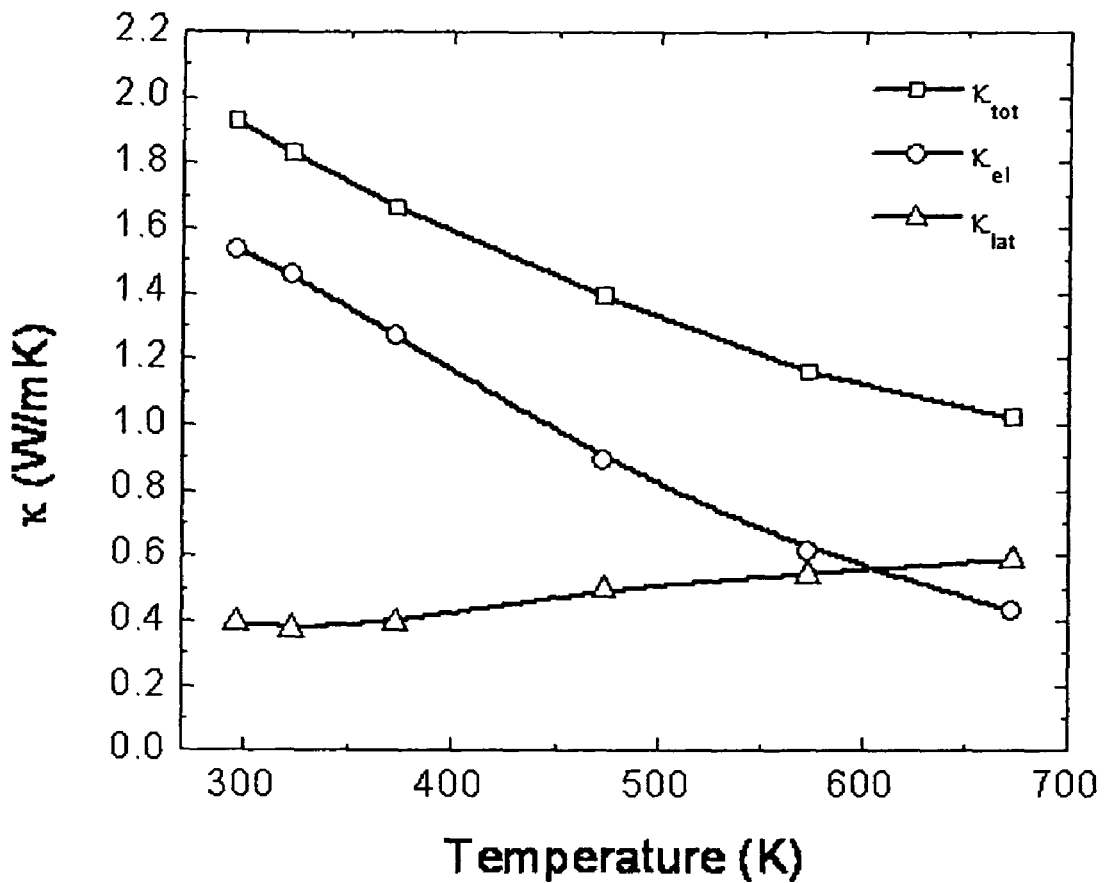
FIG. 1 is a graph showing the lowest thermal conductivity exhibited by the PbTe—PbS 16% nanocomposite.

Experimental confirmation of the above at room temperature and below comes from the PbTe—PbS 16% at. system as the plot of the lattice thermal conductivity shows in FIG. 1, a >40% reduction of the lattice thermal conductivity is observed in the case of the nano-precipitate specimen with respect to the perfect mixture of the same composition at room temperature.

It has been suggested that band gap or electron energy states engineering offer an alternative route to further enhancing the power factor of thermoelectric materials. Essentially the idea consists in the mixing of parabolic bands (bulk semiconductors) with reduced dimensionality structures (e.g. nano-dots exhibit a comb-like density of states) to produce a ripple effect on the resulting density of states of the composite.

Experimental confirmation of enhanced power factors come from the following systems shown in Table 1:

TABLE 1

| Sample composition | Power factor ($\mu W/cmK^2$) | Temperature (K) |
|---|---|---|
| PbTe-PbS 16%: $PbI_2$ 0.05% | 28 | 400 |
| PbTe-CdTe 5%: $PbI_2$ 0.05% | 30 | 300 |
| PbTe-CdTe 9% | 26 | 300 |
| PbTe-Sb 4% | 20 | 300 |
| PbTe-InSb 2% | 21 | 300 |
| PbTe-Pb (0.5%) - Sb (2%) | 28 | 300 |
| PbTe-Pb (2%) - Sb 3%) | 19 | 300 |

Method 1: Spinodal Decomposition

Spinodal decomposition refers to the way a stable single-phase mixture of two phases can be made unstable. Thermodynamically, the necessary condition for the stability or metastability of a heterogeneous phase is that the chemical potential of a component must increase with increasing density of that component. For two components this reduces to $$\left.\frac{\partial^2 G}{\partial^2 X}\right|_{T,P} > 0,$$

where X is the concentration. If this condition is not met, the mixture is unstable with respect to continuous compositional variations and the limit of this metastability is called the spinodal defined as $$\frac{\partial^2 G}{\partial^2 X} = 0,$$

where X is the concentration. Spinodal fluctuations do not involve any crystalline transformation, since both components of the mixed phase system are sharing the same lattice, but involves a spatial modulation of the local composition at the nanoscale. This spatial modulation was exploited to create coherently embedded nano-particles of a phase into a thermoelectric matrix and thus create nanostructured thermoelectric materials on a large reaction scale.

Figure 2A:
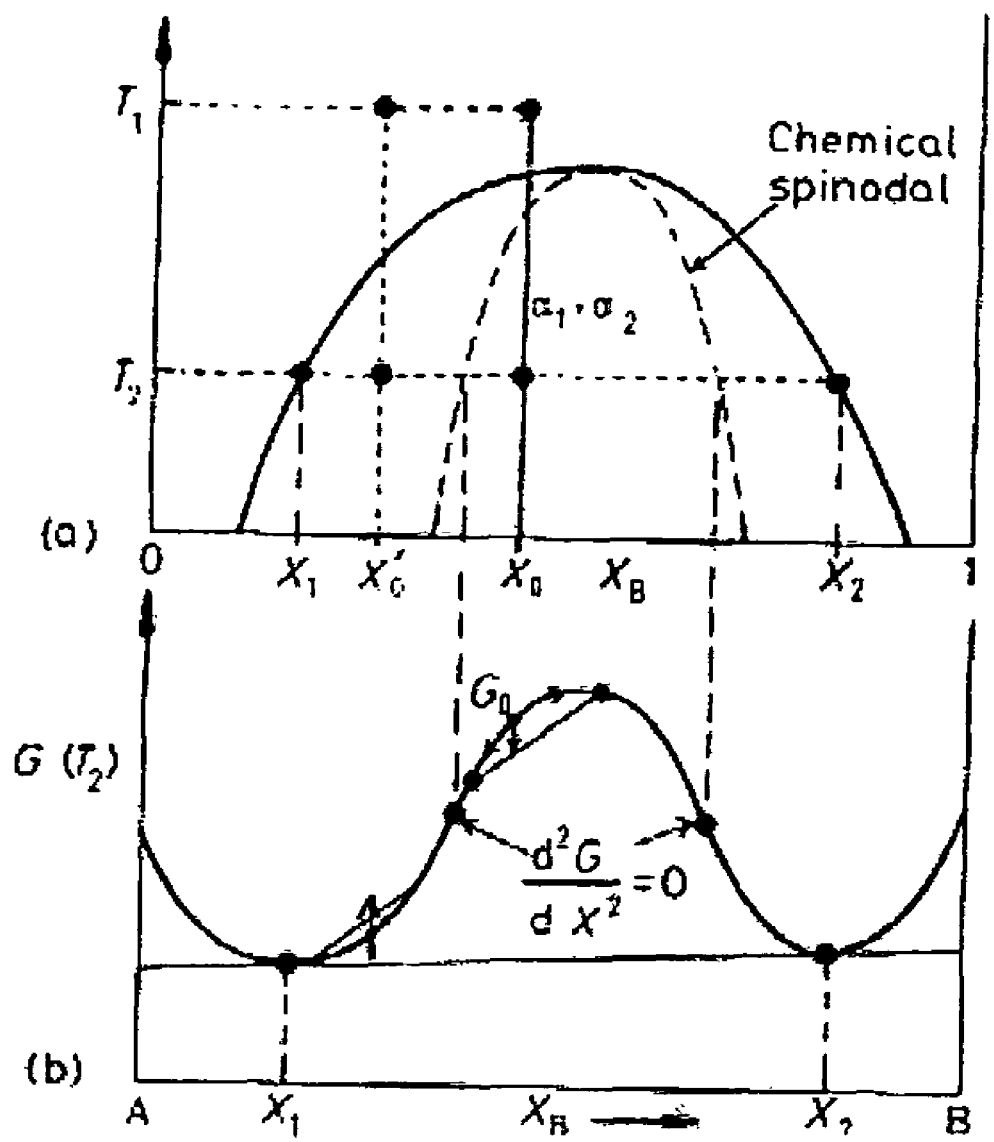
FIG. 2A is a theoretical phase diagram for A and B.

Consider a phase diagram with a miscibility gap, i.e. an area within the coexistence curve of an isobaric or an isothermal phase diagram where there are at least two phases coexisting (see FIG. 2A). If a mixture of phases A and B and of composition $X_o$ is solution treated at a high temperature $T_1$ and then quenched at to a lower temperature $T_2$ the composition instantly will be the same everywhere (ideal solid solution) and hence the system's free energy will be $G_o$ on the G(X) curve. However, infinitesimal compositional fluctuations cause the system to locally produce A-rich and B-rich regions. The system now has become unstable since the total free energy has decreased. In time, the system decomposes until the equilibrium compositions $X_1$ and $X_2$ are reached throughout the system (compare FIG. 2A and FIG. 2B).

There are two major advantages in the application of the spinodal decomposition process in order to produce thermoelectric nanocomposites; (a) thermodynamic principles define the spatial modulation wavelength $\lambda$ to be in the range $2 \leq \lambda \leq 5$ nm which is a very desirable phonon-scattering length scale and (b) the nano-structure is thermodynamically stable. Therefore, spinodally decomposed thermoelectric materials are naturally produced bulk nanocomposites which can be perpetually stable when used within a specified temperature region defined by the phase diagram.

The aforementioned procedure was applied extensively in the PbTe—PbS system where PbTe serves as the matrix.

Example

PbTe—PbS x % Preparation Example

Spinodal decomposition in the two components system PbTe—PbS x % occurs for ~4≤x≤96% for temperatures roughly below 700° C. (see accompanying phase diagram FIG. 3A). The high purity starting materials are mixed in aqua regia cleaned fused silica tubes and fired according to the reaction profile shown in FIG. 3B.

Figure 3C:
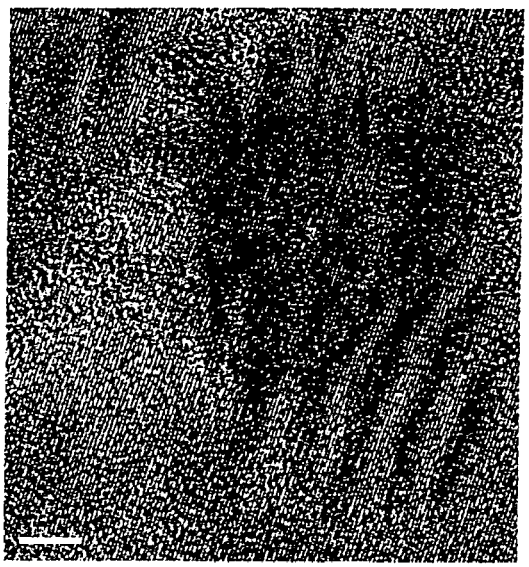
FIG. 3A shows a PbTe—PbS phase diagram.
FIG. 3B is a PbTe—PbS x % nano-composite reaction and post-annealing profile taking advantage of spinodal decomposition. FIGS.
Figure 3D:
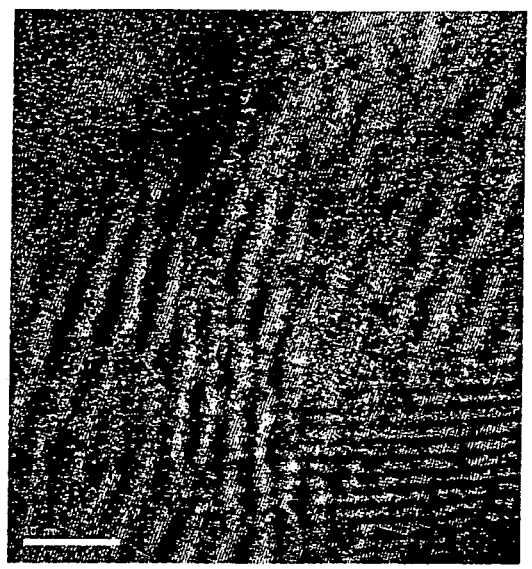

The TEM images of spinodally decomposed system PbTe—PbS 16% are shown in FIGS. 3C, 3D.

The following Table 2 show systems that can be produced to exist in a nanostructured state via the Spinodal Decomposition mechanism. The listing is a set of materials composed of component A and B in a $A_{1-x}B_x$ stoichiometry (0<x<1)

TABLE 2

| Spinodal Decomposition A-B |
|---|
| PbTe-PbS |
| $AgSbTe_2$-SnTe |
| PbS-PbTe |
| SnTe/SnSe |
| SnTe/PbS |
| SnTe/PbSe |
| SnTe/SnSe |
| SnSe/PbS |
| SnSe/PbSe |
| SnSe/PbTe |
| $AgSbSe_2$-SnTe |
| $AgSbTe_2$-SnSe |
| $AgSbSe_2$-PbTe |
| $AgSbS_2$-PbTe |
| SnTe-REPn (RE = rare earth element, Pn = P, As, Sb, Bi) |
| PbTe-REPn (RE = rare earth element, Pn = P, As, Sb, Bi) |
| PbSe-REPn (RE = rare earth element, Pn = P, As, Sb, Bi) |
| SnSe-REPn (RE = rare earth element, Pn = P, As, Sb, Bi) |

Method 2: Matrix Encapsulation

These systems, as described by a phase diagram, should have a solid solution in the composition range of approximately 0.1-15% of the minor phase. However, it has been observed that, when quenched from a melt, these systems exhibit inclusions on the nanometer scale of the minor phase material. This phenomenon can be extended to other systems of thermoelectric interest where the matrix is a good thermoelectric and the minor phase is a material that is nonreactive, has a lower melting point, and is soluble with the matrix in the liquid state. The minor phase may also be a mixture of two or more of these non-reactive materials which may or may not form a compound themselves. These materials must be quenched quickly through the melting point of the matrix in order to freeze the minor phase. After quenching the samples must be post annealed to improve crystallinity and thermoelectric properties.

Example: This method has been applied to PbTe—Sb, PbTe—Bi, PbTe—InSb and PbTe—Pb—Sb showing promise in each of the cases.

PbTe—Sb 4% Preparation Example

Lead telluride and antimony were combined in the appropriate molar ratio and sealed in an evacuated fused silica tube and heated according to the profile shown in FIG. 4B. The bright field and dark field images are shown in FIGS. 4C to 4E. The TEM images of encapsulated nanoparticles are shown in FIGS. 4F to 4K. FIG. 4L shows the lattice thermal conductivity.

Table 3 shows systems for Matrix Encapsulation listing the matrix and precipitate.

Matrix encapsulation using two or more types of nanophase particles: It is possible to produce samples via the matrix encapsulation method which have multiple nanoscale inclusions (two or more from those listed in Table 3).

These inclusions may be used to combine the favorable properties of each to produce a superior thermoelectric material. The additional phases must also be soluble with the matrix in the liquid state, may or may not be reactive with the matrix, and may or may not form a compound between each other. This method has been applied to PbTe with inclusions of both Sb and Pb with interesting behavior in terms of both the reduction of the thermal conductivity, and modification of the behavior of the electrical transport as well. The ratio of Pb to Sb can modify the conductivity such that a higher electrical conductivity may be maintained through the desired temperature range. The mass fluctuations associated with the additional phase reduce the thermal conductivity as seen in the previously discussed examples.

PbTe—Pb—Sb Preparation Example

Pb, Sb, and Te were sealed in an evacuated fused silica tube and heated to the molten state. The tube was then removed from the high temperature furnace for rapid cooling of the melt. This procedure is similar to those discussed above, however multiple nanoprecipitate inclusion phases are used rather than a single component inclusion. Many different possible inclusion combinations are possible and one example, the PbTe—Pb—Sb case, is given below.

SEM micrographs (FIGS. 5A and 5B), Powder X-ray diffraction (FIGS. 6A and 6B), TEM micrographs (FIGS. 7A and 7B), and experimental power factors and thermal conductivity values (FIG. 8). These systems represent an interesting set of materials in which the transport properties can be tuned by several variables such as total concentration, ratio of various inclusion phases, and the properties of the inclusions themselves. Optimization is still underway and ZT values of over 1 have been obtained in the as-prepared systems.

TABLE 3

| Matrix Encapsulation A (matrix) -B (precipitate) | |
|---|---|
| Pb (Te, Se, S) - (Sb, Bi, As) | Pb (Te, Se, S) -Ag4Eu |
| Pb (Te, Se, S) - (InSb, GaSb) | Pb (Te, Se, S) -AgEu |
| Pb (Te, Se, S) -Yb | Pb (Te, Se, S) -AgCe |
| Pb (Te, Se, S) - (InAs, GaAs) | Pb (Te, Se, S) -Mg2Cu |
| Pb (Te, Se, S) -Eu | Pb (Te, Se, S) -Cu2La |
| Pb (Te, Se, S) -In | Pb (Te, Se, S) -Cu6Eu |
| Pb (Te, Se, S) -Ga | Pb (Te, Se, S) Eu3Pd2 |
| Pb (Te, Se, S) -Al | Pb (Te, Se, S) -Mg2Eu |
| Pb (Te, Se, S) -Zn | Pb (Te, Se, S) -PdTe2 |
| Pb (Te, Se, S) -Cd | Pb (Te, Se, S) -Mg2Sn |
| Pb (Te, Se, S) -Sn | Pb (Te, Se, S) -MgSm |
| Pb (Te, Se, S) -TlInQ2* | Pb (Te, Se, S) -MgPr |
| Pb (Te, Se, S) -ZnxSby | Pb (Te, Se, S) -Mg2Pb |
| Pb (Te, Se, S) -AgYb | Pb (Te, Se, S) -Ca84Ni16 |
| Pb (Te, Se, S) -CdPd | Pb (Te, Se, S) -RE2Pb (RE = rare earth element) |
| Pb (Te, Ae, S) -REPb3 (RE = rare earth element, Y) | Pb (Te, Se, S) -Mg2Pb |
| Pb (Te, Se, S) -M (M = Ge, Sn, Pb) | Pb (Te, Se, S) -REPb (RE = rare earth element) |

*Q = S, Se, Te

Method 3: Nucleation and Growth Mechanism:

The method of nucleation and growth of nanoparticles within the matrix of a thermoelectric material consists of three distinct thermal treatments that depend crucially on the phase diagram of the composite:

a) The starting materials (mixed in appropriate stoichiometry) are heated from the two-phase region to the single-phase region of the phase diagram to dissolve all precipitates. The mixture is held there for several hours to ensure complete homogeneity;

b) The melt or solid solution is quenched to room temperature using different methods: air quenching, water quenching, ice water quenching. This freezes the high temperature homogenous phase into a supersaturated solid solution; and c) Depending on the kinetics of the specific system the specimen is post annealed at an elevated temperature within the two-phase region of the phase diagram and is held there for several hours to allow the nano-precipitates to form and grow. Annealing time and temperature is proportional to the size growth of the precipitates. Therefore, the size of the nano-precipitates can be controlled through careful selection of annealing time and temperature.

The following schematic shows in FIGS. 9A, 9B and 9C roughly how the nano-precipitation of the second phase is taking place.

As a general rule this kind of nanostructured thermoelectric materials should meet two conditions: (1) The two phases should contain elements that enter a solid solution phase at a specific temperature and separate into a mixture at another lower temperature. (2) The phase that precipitates out must create a coherent or at best semi-coherent precipitate. Coherency is important since it ensures bonding with the lattice of the matrix and hence the precipitate does not act as a strong scatterer to the electrons.

The above procedure has been extensively applied to the PbTe—CdTe system with excellent results.

Example

PbTe—CdTe x % Preparation Example

Stoichiometric quantities of Pb, Te and Cd are weighed targeting x % values in the range $2 \leq x \leq 9$. The starting materials are placed in graphite crucibles, which are subsequently sealed under high vacuum in fused silica tubes and fired according to the reaction profile shown below (FIG. 9E). The reaction profile is decided based on the phase diagram of the PbTe—CdTe system (FIG. 9D). FIGS. 9F and 9G show the TEM images for precipitation and growth of PbS—PbTe 6%. FIGS. 9H and 9I show the system PbTe—CdTe 9%.

The following Table 4 shows systems for nucleation and growth listing the matrix and precipitate.

TABLE 4

| Nucleation and Growth A(matrix) -B (precipitate) |
| --- |
| PbSe-Sb$_2$Se$_3$ |
| PbSe-SnSe$_2$ |
| PbSe-Zn |
| PbTe-Hg$_{1-x}$Cd$_x$Te (0 < x < 1) |
| PbTe-ZnTe |
| PbTe-Sb$_2$Se$_3$ |
| PbTe-Zn |
| PbTe-In$_2$Se$_3$ |
| PbTe-In$_2$Te$_3$ |
| PbTe-Ga$_2$Te$_3$ |
| PbTe-AgInTe$_2$ |
| PbTe-CuInTe$_2$ |
| PbTe-CuInSe$_2$ |
| PbTe-CuInTe$_2$ |
| PbSe-Hg$_{1-x}$Cd$_x$Q (0 < x < 1, Q = S, Se, Te) |
| PbSe-ZnTe |
| PbSe-In$_2$Se$_3$ |
| PbSe-In$_2$Te$_3$ |
| PbSe-Ga$_2$Te$_3$ |
| PbSe-AgInSe$_2$ |
| PbSe-CuInTe$_2$ |
| PbSe-CuInSe$_2$ |
| PbSe-CuInTe$_2$ |

It is intended that the foregoing description be only illustrative of the present invention and that the present invention be limited only by the hereinafter appended claims.

We claim:

1. A process for preparing a thermoelectric material composition, the process comprising:
   (a) forming a homogeneous liquid solution of a first chalcogenide;
   (b) cooling the homogeneous liquid solution; and
   (c) forming, by the cooling, from the homogeneous liquid solution, both a matrix comprising a solid solution of the first chalcogenide and nanoscale inclusions in the matrix, the nanoscale inclusions having a different composition than the first chalcogenide, and configured so that the inclusions decrease the thermal conductivity of the composition while substantially maintaining or increasing electrical conductivity and Seebeck coefficient of the composition.

2. The process of claim 1, wherein the inclusions have a first melting point, the matrix has a second melting point, and the first melting point is lower than the second melting point.

3. The process of claim 1, wherein the inclusions have a first melting point, the matrix has a second melting point, and the second melting point is lower than the first melting point.

4. The process of claim 1, wherein the inclusions have a first melting point, the matrix has a second melting point, and the first melting point is different than the second melting point.

5. The process of claim 1, wherein the composition has a first thermoelectric figure of merit, the matrix has a second thermoelectric figure of merit, and the first thermoelectric figure of merit is higher than the second thermoelectric figure of merit.

6. The process of claim 1, wherein at least a portion of the inclusions are a uniform precipitated dispersion of nanoparticles.

7. The process of claim 1, wherein at least a portion of the liquid solution or compound further comprises a semiconductor.

8. The process of claim 1, wherein at least a portion of the liquid solution or compound further comprises a metal.

9. The process of claim 1, wherein a portion of the inclusions are formed by spinodal decomposition as a result of annealing the solid solution at an appropriate temperature less than a melting point of the solid solution.

10. The process of claim 9, wherein at least a portion of the inclusions comprise compositional fluctuations on a nanometer length scale generated by the spinodal decomposition.

11. The process of claim 10, wherein spatial modulation wavelength of the composition for at least some compositional fluctuations is greater or equal than 2 nm and less than or equal to 5 nm.

12. The process of claim 9, wherein the spinodal decomposition substantially does not comprise crystalline transformation.

13. The process of claim 1, wherein at least a portion of the inclusions are formed by matrix encapsulation as a result of the cooling of the liquid solution or compound.

14. The process of claim 13, wherein about 0.1 to 15% of the composition comprises the inclusions.

15. The process of claim 13, wherein at least a portion of the inclusions are a material that is nonreactive, has a lower melting point, and is soluble with the matrix in a liquid state.

16. The process of claim 1, further comprising heat treating the composition after the cooling of the homogeneous liquid solution.

17. The process of claim 1, wherein a portion of the inclusions are formed by nucleation and growth in a supersaturated solid solution of the matrix.

18. The process of claim 17, further comprising heating from a two-phase region to a single-phase region of a phase diagram of the composition to dissolve all precipitates.

19. The process of claim 18, wherein the cooling of the homogeneous liquid solution comprises quenching the homogeneous liquid solution to form the supersaturated solid solution.

20. The process of claim 17, further comprising heat treating the supersaturated solid solution within the two-phase region to form and grow the inclusions.

21. The process of claim 20, further comprising selecting annealing time and temperature to control inclusion size.

22. The process of claim 1, wherein the first chalcogenide comprises a chalcogen selected from the group consisting of tellurium, sulfur and selenium.

23. The process of claim 1, wherein at least a portion of the inclusions are between about 1 and 200 nanometers.

24. The process of claim 1, wherein the inclusions comprise multiple types of inclusions, each type having a different chemistry.

25. The process of claim 1, wherein the cooling of the homogeneous liquid solution comprises quenching the homogeneous liquid solution.

26. The process of claim 25, wherein the quenching of the homogeneous liquid solution forms a supersaturated solid solution.

27. The process of claim 1, wherein the composition has lattice thermal conductivity which is more than 40% reduced as compared to lattice thermal conductivity of the matrix.

28. The process of claim 1, wherein the forming of homogeneous liquid solution is under high vacuum.

29. The process of claim 1, wherein the matrix comprises PbTe.

30. The process of claim 1, wherein the matrix comprises PbQ, and the Q component comprises at least one element selected from the group consisting of: Te, Se, and S.

31. The process of claim 1, wherein the matrix comprises SnQ, and the Q component comprises at least one element selected from the group consisting of: Te and Se.

32. The process of claim 1, wherein at least a portion of the inclusions are coherent or semi-coherent with the matrix.

33. The process of claim 1, wherein at least a portion of the inclusions are coherent with the matrix.

34. The process of claim 1, wherein at least a portion of the inclusions do not act as a strong scatterer to electrons.

35. The process of claim 1, wherein the homogeneous liquid solution is a molten solution.

36. The process of claim 1, wherein at least a portion of the inclusions in the matrix are thermally stable to a temperature higher than 650 K.

37. A method for manufacturing a thermoelectric composition, the method comprising:
   forming a homogeneous liquid solution comprising at least one chalcogen; and
   forming, by the cooling, from the homogeneous liquid solution, nanoparticles embedded within a matrix which have a different composition than the matrix, the matrix comprising at least one chalcogenide, and configuring so that at least a portion of the nanoparticles decrease the thermal conductivity of the composition while substantially maintaining or increasing electrical conductivity and Seebeck coefficient of the composition.

* * * * *

UNITED STATES PATENT AND TRADEMARK OFFICE
CERTIFICATE OF CORRECTION

| | |
|---|---|
| PATENT NO. | : 7,847,179 B2 |
| APPLICATION NO. | : 11/445662 |
| DATED | : December 7, 2010 |
| INVENTOR(S) | : Kanatzidis et al. |

It is certified that error appears in the above-identified patent and that said Letters Patent is hereby corrected as shown below:

On the Title Page at Item (56), Page 3, Column 1, Line 20, under Other Publications, change "Thermolectrics," to --Thermoelectrics,--.

On the Title Page at Item (56), Page 3, Column 1, Line 41, under Other Publications, change "Thermoelectrice" to --Thermoelectric--.

On the Title Page at Item (56), Page 4, Column 1, Line 5, under Other Publications, change "naostructuring" to --nanostructuring--.

On the Title Page at Item (56), Page 4, Column 1, Line 60, under Other Publications, change "$AgBiSe_2$," to --$AgBiS_2$,--.

On the Title Page at Item (56), Page 4, Column 2, Line 7, under Other Publications, change "Themoelectric" to --Thermoelectric--.

In the Drawing, Sheet 2 of 14, FIGURE 2A, Line 1, above "$\alpha_1 + \alpha_2$" insert --$\alpha$--.

In Column 4, Line 35, change "supperlattice" to --superlattice--.

In Column 6, Line 42, after "(0<x<1)" insert --.--.

In Column 12, Line 17, In Claim 37, change "configuring" to --configured--.

Signed and Sealed this
Eleventh Day of October, 2011

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,847,179 B2 |
| APPLICATION NO. | : 11/445662 |
| DATED | : December 7, 2010 |
| INVENTOR(S) | : Mercouri G. Kanatzidis, John Androulakis and Joseph R. Sootsman |

It is certified that error appears in the above-identified patent and that said Letters Patent is hereby corrected as shown below:

In the Specification

Column 1, line 12, delete – "STATEMENT REGARDING FEDERALLY SPONSORED RESEARCH OR DEVELOPMENT
Not Applicable"

Column 1, line 15, delete "STATEMENT REGARDING GOVERNMENT RIGHTS
Not Applicable", and insert therefor –

--GOVERNMENT SUPPORT CLAUSE

This invention was made with government support under N00014-03-1-0789 awarded by the Office of Naval Research. The government has certain rights in the invention.--

Signed and Sealed this
Eighth Day of April, 2014

Michelle K. Lee
*Deputy Director of the United States Patent and Trademark Office*